(12) United States Patent
Ozawa et al.

(10) Patent No.: US 7,198,448 B2
(45) Date of Patent: Apr. 3, 2007

(54) VACUUM PROCESS SYSTEM

(75) Inventors: Jun Ozawa, Nakakoma-gun (JP); Jun Hirose, Nakakoma-gun (JP); Masaki Narushima, Higashiyatsushiro-gun (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/332,653

(22) Filed: Jan. 13, 2006

(65) Prior Publication Data

US 2006/0182539 A1  Aug. 17, 2006

Related U.S. Application Data

(63) Continuation of application No. 10/614,777, filed on Jul. 7, 2003, now Pat. No. 7,025,554, which is a continuation of application No. 09/856,411, filed as application No. PCT/JP99/06408 on Nov. 17, 1999.

(30) Foreign Application Priority Data

Nov. 17, 1998 (JP) .............................. 10-343596
Dec. 25, 1998 (JP) .............................. 10-369138

(51) Int. Cl.
*B65G 49/07* (2006.01)
(52) U.S. Cl. ...................... 414/217; 414/939
(58) Field of Classification Search .............. 414/217, 414/939
See application file for complete search history.

(56) References Cited

U.S. PATENT DOCUMENTS

| 4,483,651 | A |   | 11/1984 | Nakane et al. |
|---|---|---|---|---|
| 5,357,115 | A | * | 10/1994 | Asakawa et al. ...... 250/442.11 |
| 5,695,564 | A |   | 12/1997 | Imahashi |
| 5,846,328 | A |   | 12/1998 | Aruga et al. |
| 5,855,726 | A |   | 1/1999 | Soraoka et al. |
| 5,882,165 | A |   | 3/1999 | Maydan et al. |
| 6,045,315 | A | * | 4/2000 | Azumano et al. ........... 414/217 |
| 6,079,927 | A |   | 6/2000 | Muka |

(Continued)

FOREIGN PATENT DOCUMENTS

| JP | 60-115216 | 6/1985 |
|---|---|---|
| JP | 3-273606 | 12/1991 |
| JP | 04-247632 | 9/1992 |
| JP | 5-226455 | 9/1993 |
| JP | 06-97258 | 4/1994 |
| JP | 08-241867 | 9/1996 |
| JP | 09-36198 | 2/1997 |
| KR | 1995-0034563 | 12/1995 |

*Primary Examiner*—James Keenan
(74) *Attorney, Agent, or Firm*—Morrison & Foerster LLP

(57) ABSTRACT

A vacuum process system comprises: a load port on which an object to be processed is set; a common transfer chamber disposed adjacent to the load port, having an internal space set at an atmospheric pressure level, and including a first transfer device that is movable and transfers the object into/from the load port, the first transfer device being disposed within the internal space; and a process unit having one process chamber for subjecting the object to a predetermined process, and a vacuum transfer chamber connected to the process chamber, having an internal space set at a vacuum pressure level, and including a second transfer device for transferring the object into/from the process chamber, the second transfer device being disposed within the internal space. The process units are individually connected to the common transfer chamber such that the process units are substantially parallel to each other. The vacuum chamber of each process unit is connected to the common transfer chamber. Each process unit extends linearly in a direction substantially perpendicular to the common transfer chamber. The object is transferred into/from the vacuum transfer chamber by means of the first transfer device.

9 Claims, 18 Drawing Sheets

U.S. PATENT DOCUMENTS

| | | |
|---|---|---|
| 6,235,634 B1 | 5/2001 | White et al. |
| 6,257,827 B1 | 7/2001 | Hendrickson et al. |
| 6,428,262 B1 * | 8/2002 | Vanderpot et al. .......... 414/217 |
| 6,540,869 B2 | 4/2003 | Saeki et al. |
| 6,729,824 B2 | 5/2004 | Lei et al. |
| 2002/0006323 A1 | 1/2002 | Yoshida et al. |
| 2004/0117059 A1 | 6/2004 | Iljima et al. |
| 2005/0220577 A1 | 10/2005 | Iljima et al. |

* cited by examiner

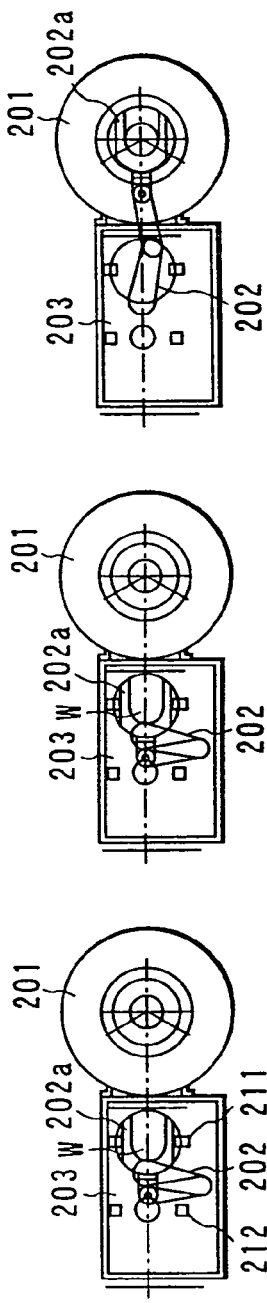

VACUUM PROCESS SYSTEM

CROSS REFERENCE TO RELATED APPLICATIONS

This is a continuation of U.S. patent application Ser. No. 10/614,777 filed Jul. 7, 2003, now U.S. Pat. No. 7,025,554 B2, which in turn is a continuation of U.S. patent application Ser. No. 09/856,411, filed May 17, 2001 (now abandoned), which was a U.S. national stage of International Application No. PCT/JP99/06408, filed on Nov. 17, 1999, which in turn claims priority to Japanese Patent Application No. 10-343596 filed on Nov. 17, 1998 and Japanese Patent Application No. 10-369138 filed on Dec. 25, 1998, the disclosures of each of which are incorporated herein by reference in their entirety.

TECHNICAL FIELD

The present invention relates to a vacuum process system for subjecting an object to be processed, such as a semiconductor wafer or an LCD substrate, to a predetermined process.

BACKGROUND ART

In general, in order to fabricate a semiconductor device, a semiconductor wafer has to be subjected to various processes such as a film-forming process, an oxidation process, a diffusion process, an etching process, and an annealing process. Even in the film-forming process, various film-forming processes are performed to form, for example, an insulating film and films containing different metals.

In these years, a so-called cluster tool has widely been used as a vacuum process system wherein process chambers for performing the above-mentioned various processes are properly combined and the process chambers are connected by a transfer chamber, with a view to enhancing a through-put, improving a countermeasure against particles, preventing formation of a natural oxide film, etc.

FIG. 18 is a schematic view showing the structure of such a conventional vacuum process system 2. As is shown in the Figure, in the vacuum process system 2, three process chambers 6A, 6B and 6C, for example, are coupled to a transfer chamber 4 via gate valves G1 to G3. In addition, two cassette chambers 8A and 8B are connected to the transfer chamber 4 via gate valves G4 and G5. A flexible and rotatable transfer arm 10 provided in the transfer chamber 4 is driven to take in a semiconductor wafer W from a cassette C, and transfer the wafer W into a desired chamber or among the process chambers 6A, 6B and 6C. In this case, the kinds of processes to be carried out in the process chambers 6A to 6C are properly chosen according to necessity, and the process chambers corresponding to these processes are provided.

In the above-described vacuum process system, the single transfer arm 10 manages, conveys and transfers wafers W among the three process chambers 6A to 6C and two cassette chambers 8A and 8B. Thus, the transfer arm 10 is required to move in a very complex manner, and the through-put deteriorates. In particular, the process time in each of the process chambers 6A to 6C is shortened by the enhancement of the performance of each process chamber, and accordingly the movement of the transfer arm 10 becomes more complex and the through-put further deteriorates.

Besides, there is a tendency that semiconductor devices have multi-layer structures, and it is necessary to form multi-layer films containing different kinds of metals. Because of this, in some cases, process chambers using film-forming gases containing different metals may be combined. Under the circumstances, the following problem arises in the vacuum process system with the above-described structure. That is, even if the inside of the process chamber is evacuated following $N_2$ purge, etc. after the process is completed, a slight amount of metal gas, etc. enters the transfer chamber 4 at the time of transfer of the wafer W, thus disadvantageously contaminating the semiconductor wafer W with the metal. More specifically, in the vacuum process system having the above-described structure, the process chambers 6A to 6C are radially arranged around the polygonal transfer chamber 4 and the openings of the process chambers 6A to 6C are directed to the central part of the transfer chamber 4. Thus, when the process chambers 6A to 6C are opened, cross-contamination may occur between adjacent process chambers.

Furthermore, since plural process chambers 6A to 6C are provided relative to the single transfer chamber 4, the operations of all the process chambers must be stopped when any one of the process chambers has malfunctioned or requires maintenance.

Besides, the process chambers need to be spaced apart (with intervals) in consideration of the maintenance of the process chambers 6A to 6C or the transfer arm 10 in the transfer chamber 4. Consequently, the size of the whole apparatus as well as the cost will increase.

DISCLOSURE OF INVENTION

The object of the present invention is to provide a vacuum process system that can enhance a through-put by avoiding complexity of transfer paths, eliminate the possibility of occurrence of cross-contamination, and decrease the size and cost of the system.

This object can be achieve by a vacuum process system comprising: a load port on which an object to be processed is set; a common transfer chamber disposed adjacent to the load port, having an internal space set at an atmospheric pressure level, and including a first transfer device that is movable and transfers the object into/from the load port, the first transfer device being disposed within the internal space; and a process unit having one process chamber for subjecting the object to a predetermined process, and a vacuum transfer chamber connected to the process chamber, having an internal space set at a vacuum pressure level, and including a second transfer device for transferring the object into/from the process chamber, the second transfer device being disposed within the internal space, wherein a plurality of the process units are individually connected to the common transfer chamber such that the process units are substantially parallel to each other, and the vacuum chamber of each process unit is connected to the common transfer chamber, each process unit extends linearly in a direction substantially perpendicular to the common transfer chamber, and the object is transferred into/from the vacuum transfer chamber by means of the first transfer device.

BRIEF DESCRIPTION OF DRAWINGS

FIGS. 10A to 10K illustrate the operation of the transfer arm shown in FIG. 9A;

BEST MODE FOR CARRYING OUT OF THE INVENTION

Embodiments of the present invention will now be described with reference to the accompanying drawings.

Figure 1:
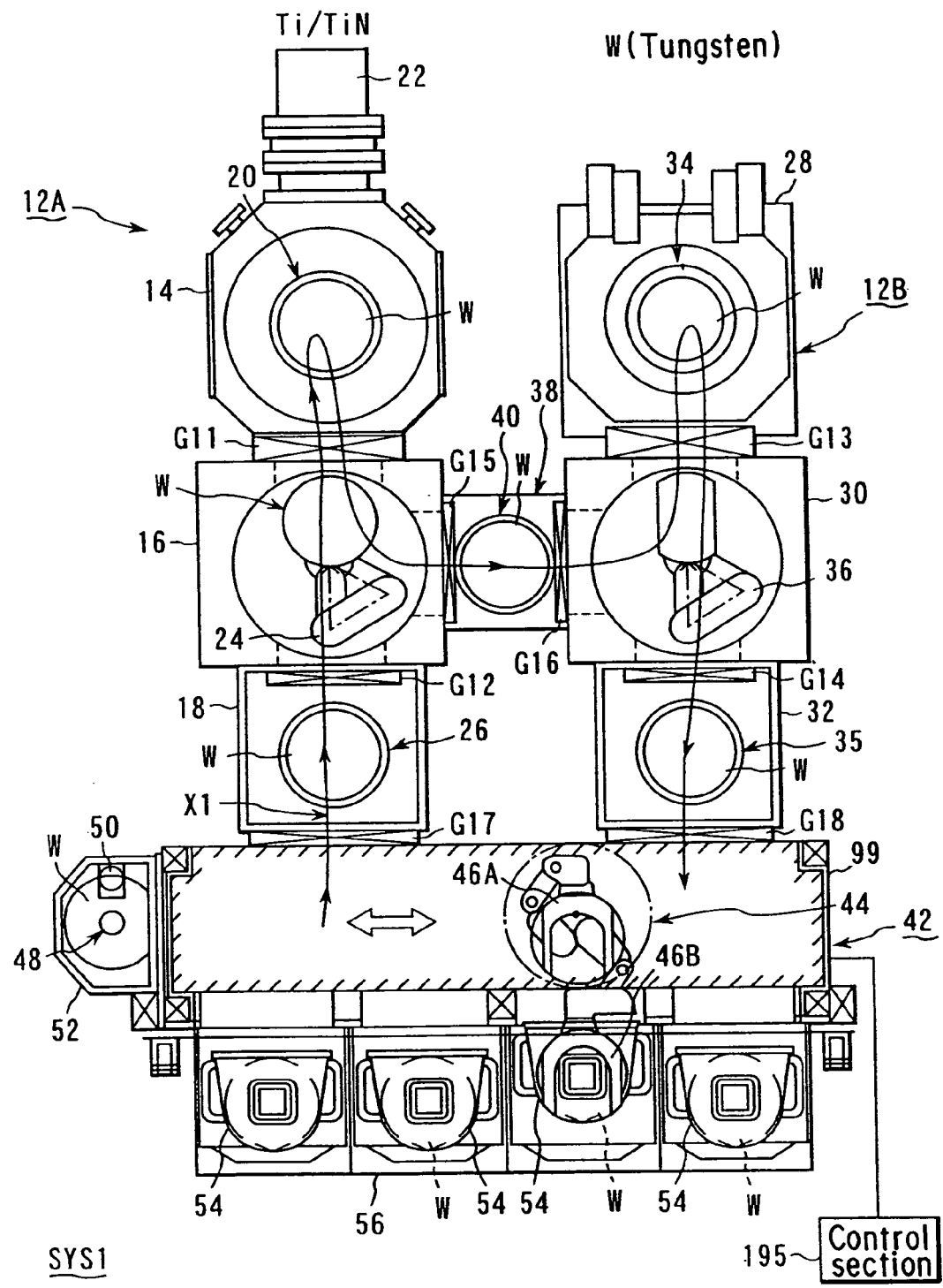
FIG. 1 is a schematic view showing the structure of a vacuum process system according to a first embodiment of the present invention.

FIG. 1 is a schematic view showing the structure of a vacuum process system according to a first embodiment of the present invention.

As is shown in the Figure, the vacuum process system SYS1 is mainly composed of a first process unit 12A for applying a first process to a semiconductor wafer W, or an object to be processed, and a second process unit 12B for applying a second process thereto.

Assume that a Ti/TiN film, for instance, is formed by sputtering in the first process unit 12A, and a tungsten film is formed by means of thermal CVD (Chemical Vapor Deposition) in the second process unit 12B.

The first process unit 12A includes a sputter process chamber 14 for performing a successive process on the Ti/TiN film by means of sputtering; a first transfer chamber 16 for transferring the semiconductor wafer W into/from the process chamber 14; and a first load lock chamber 18 for transferring the wafer W into/from the transfer chamber 16.

The sputter process chamber 14 can be supplied with a film forming gas and evacuated. The sputter process chamber 14 includes a susceptor 20 for mounting of the wafer W and is equipped with a vacuum pump 22 for evacuating the inside of the process chamber. An air-tightly openable/closable gate valve G11 is provided between the sputter process chamber 14 and the first transfer chamber 16.

The first transfer chamber 16 is formed as a vacuum transfer chamber capable of $N_2$ purge and evacuation. The first transfer chamber 16 includes, for example, a flexible and rotatable multi-joint transfer arm (transfer device) 24 for transfer of the wafer W. An air-tightly openable/closable gate valve G12 is provided between the first transfer chamber 16 and the first load lock chamber 18.

The first load lock chamber 18 is formed as a vacuum transfer chamber capable of $N_2$ purge and evacuation. The first load lock chamber 18 includes a transfer table 26 for mounting of the wafer W. The transfer table 26, where necessary, may be provided with a cooling jacket for cooling a processed wafer W, or a heating lamp for preheating a to-be-processed wafer W. Transfer tables 26 in multiple stages may be provided for mounting of plural wafers W.

On the other hand, the second process unit 12B includes a CVD process chamber 28 for forming, for example, a tungsten film by means of CVD; a second transfer chamber 30 for transferring the semiconductor wafer W into/from the process chamber 28; and a second load lock chamber 32 for transferring the wafer W into/from the transfer chamber 30. The CVD process chamber 28 can be supplied with a film forming gas and evacuated. The CVD process chamber 28 includes a susceptor 34 for mounting of the wafer W. An air-tightly openable/closable gate valve G13 is provided between the CVD process chamber 28 and the second transfer chamber 30.

The second transfer chamber 30 is formed as a vacuum transfer chamber capable of $N_2$ purge and evacuation. The second transfer chamber 30 includes, for example, a flexible and rotatable multi-joint transfer arm 36 for transfer of the wafer W. An air-tightly openable/closable gate valve G14 is provided between the second transfer chamber 30 and the second load lock chamber 32.

The second load lock chamber 32 is formed as a vacuum transfer chamber capable of $N_2$ purge and evacuation. The second load lock chamber 32 includes a transfer table 35 for mounting of the wafer W. The transfer table 35, where necessary, may be provided with a cooling jacket for cooling a processed wafer W, or a heating lamp for preheating a to-be-processed wafer W. Transfer tables 35 in two stages may be provided for mounting of plural (e.g. two) wafers W.

An intermediate path chamber 38 is interposed between the first transfer chamber 16 and second transfer chamber 30. The intermediate path chamber 38, too, is capable of $N_2$ purge and evacuation and includes a table 40 for mounting of the wafer W. Air-tightly openable/closable gate valves G15, G16 are provided between the intermediate path chamber 38, on the one hand, and the first transfer chamber 16 and second transfer chamber 30, on the other hand, which stand on both sides. Accordingly, the wafer W can be transferred or moved between the first and second transfer chambers 16, 30 via the intermediate path chamber 38.

The first and second load lock chambers 18 and 32 are commonly coupled to a process-object transfer stage (a shared transfer chamber with its inside set at an atmospheric pressure level) 42 via air-tightly openable/closable gate valves G17, G18. A transfer arm (transfer device) 44 for the stage, which is movable along a guide rail (not shown) extending in the longitudinal direction of the stage 42, is disposed within the inside space of the transfer stage 42. The transfer arm 44 has, for example, wafer-transferring multi-joint forks 46A, 46B that are driven independently. The forks 46A, 46B, too, are flexible and rotatable. The stage 42 is flanked by an alignment chamber 52 including a rotary table 48 and an optical sensor 50 for optically sensing an edge portion of the wafer W. An orientation flat, a notch, or the like of the wafer W is sensed for alignment. The entirety of the stage 42 is accommodated in a rectangular stage container 99 in which a downward flow of $N_2$ gas is produced, for example, at an atmospheric pressure level. A cassette table 56 functioning as a load port capable of holding, for example, four cassette containers 54, is provided in front of the stage 42. Each cassette container 54 is provided with a cover for sealing and therein supports, e.g. 25 12-inch wafers W in multiple stages.

The operation of the vacuum process system SYS1 with the above-described structure will now be described.

In FIG. 1, an arrow X1 indicates an example of a transfer path for the wafer W. To start with, a wafer W to be processed, which is contained in one of the cassette containers 54, is taken out of the container 54 by means of the transfer arm 44 for the stage. The wafer W is then placed and aligned on the rotary table 48 in the alignment chamber 52.

The aligned wafer W is conveyed by one of the multi-joint forks of the transfer arm 44 for the stage, for example, the fork 46A, and transferred in the direction of arrow X1 onto the transfer table 26 within the first load lock chamber 18 which is restored at the atmospheric pressure level. At this time, the wafer W may be heated, on an as-needed basis, to carry out a degasing or preheating process for removing an adhering gas.

After the transfer, the gate valve G17 is closed and the first load lock chamber 18 is sealed. The inside of the first load lock chamber 18 is evacuated to a predetermined pressure level and then made to communicate with the first transfer chamber 16, which has been evacuated in advance, by means of the gate valve G12. The transfer arm 24 in the first transfer chamber 16 holds the wafer W on the transfer table 26 and transfers it onto the susceptor 20 in the sputter process chamber 14 which has been evacuated in advance.

Following the completion of the transfer of the wafer W, the gate valve G11 is closed and a Ti/TiN film is formed on the wafer W within the sputter process chamber 14 on the basis of predetermined process conditions. After a residual process gas within the sputter process chamber 14 is exhausted, the wafer W on which the film has been formed is taken out by the transfer arm 24 and transferred onto the table 40 in the intermediate path chamber 38 which has been evacuated in advance. The gate valve G15 is then closed to isolate the intermediate path chamber 38 from the first transfer chamber 16 and to prevent a metal film-formation gas, etc. from entering the intermediate path chamber 38. In this case, the intermediate path chamber 38 may be further evacuated to completely exhaust a very small amount of metal film-formation gas that may have entered.

The intermediate path chamber 38 is then made to communicate with the second transfer chamber 30 by means of the gate valve G16. The transfer arm 36 in the second transfer chamber 30 holds the wafer W on the table 40 and transfers it onto the susceptor 34 in the CVD process chamber 28 which has been evacuated in advance.

The gate valve G13 is then closed to form a tungsten film on the wafer W within the CVD process chamber 28 on the basis of predetermined process conditions.

After a residual process gas within the CVD process chamber 28 is exhausted, the wafer W on which the film has been formed is taken out of the CVD process chamber 28 by the transfer arm 36. With the gate valve 14 opened, the wafer W is transferred onto the transfer table 35 in the second load lock chamber 32 which has been evacuated in advance.

Subsequently, the gate valve 14 is closed and the inside of the second load lock chamber 32 is subjected to $N_2$ purge and restored to the atmospheric pressure level. The wafer W on the transfer table 35 is cooled and then the gate valve G18 is opened to enable the second load lock chamber 32 to communicate with the process-object transfer stage 42. The transfer arm 44 of the stage 42 holds the processed wafer W and places it in a predetermined one of the cassette containers 54. The series of these operations are performed along the transfer path indicated by arrow X1.

Figure 18:
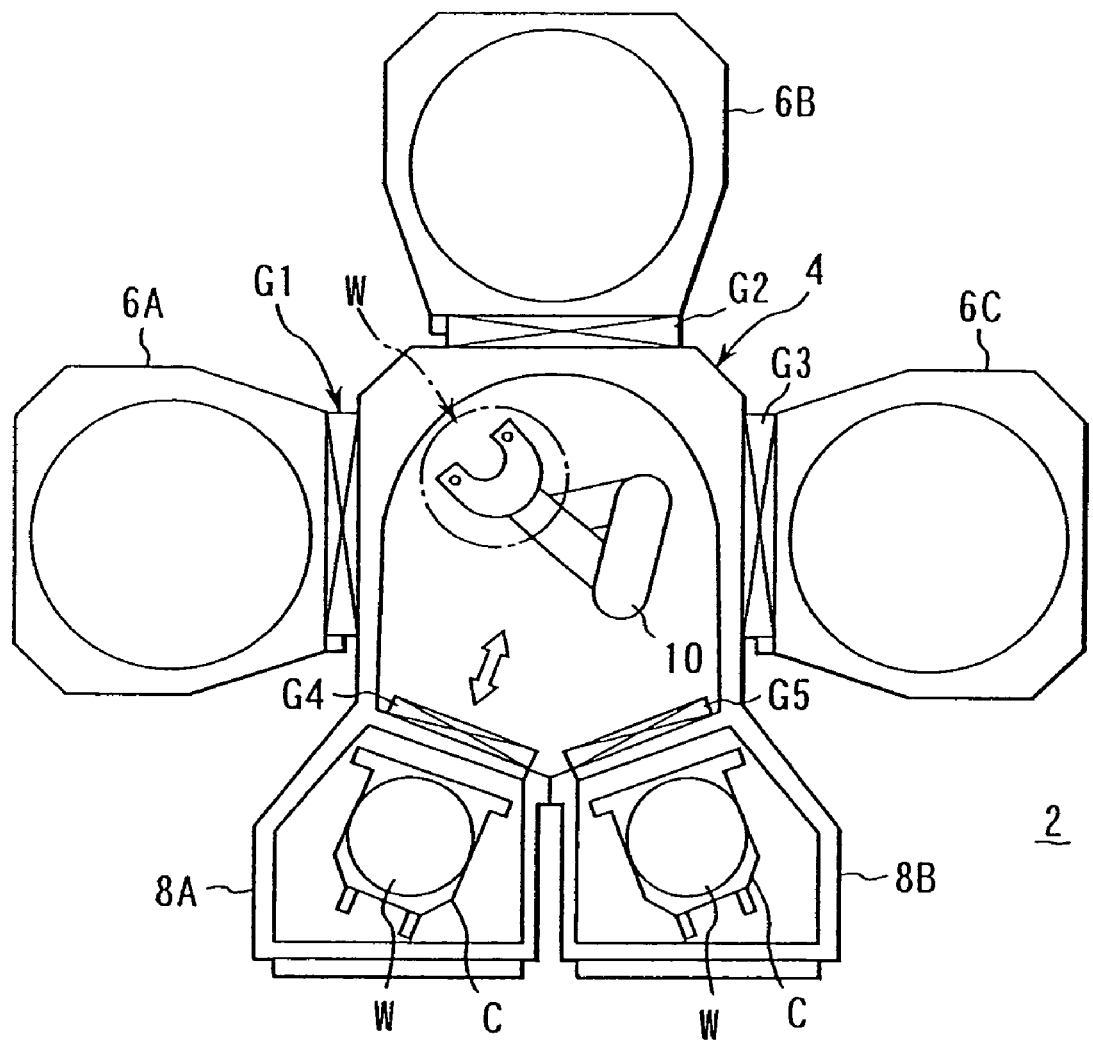
FIG. 18 is a schematic view showing the structure of a conventional cluster tool.

As has been described above, in the present embodiment, each process unit 12A (12B) comprises the process chamber 14 (28) and the associated vacuum transfer chambers 16, 18 (30, 32) and is individually connected to the common process-object transfer stage (shared transfer chamber set at the atmospheric pressure) 42. In other words, the plural process-completion type process units 12A, 12B, in each of which the process chamber and vacuum transfer chamber are provided in a 1-to-1 relationship, are individually connected to the common process-object transfer stage 42. Moreover, the transfer chambers 16, 30 of the process units 12A, 12B are mutually coupled via the openable/closable gate valves G15, G16 and intermediate path chamber 38. They are isolated from each other, where necessary. While plural kinds of processes can be performed, the flow of gas between both transfer chambers 16, 30 (between the process units 12A, 12B) can be prevented. More specifically, even where different kinds of metal film-formation methods, for example, PVD and CVD, are carried out at the same time, as in the present embodiment, contamination of metal between the process units 12A, 12B can be prevented (i.e. occurrence of cross-contamination can be prevented). While a process is being performed in one of the process units 12A (12B), another process can be performed in the other process unit 12B (12A). Therefore, the through-put can be enhanced. Unlike the conventional system shown in FIG. 18, when the maintenance, etc. is conducted for one of the process units 12A (12B), the other process unit 12B (12A) can be independently operated only by closing the gate valves G15, G16. Furthermore, since the respective chambers are not so tightly arranged as in the system shown in FIG. 18, the maintenance work can be easily conducted.

In the present embodiment, the process units 12A, 12B are arranged in parallel and in a direction perpendicular to the longitudinal direction of the process-object transfer stage 42 (the direction of movement of the transfer arm 44). Thus, the wafer W, which has been transferred from the process-object transfer stage 42 into the process unit 12A, 12B, is transferred along the substantially linearly transfer path in the process unit 12A, 12B and is processed. Accordingly, the transfer path of the wafer W is not crossed in a complicated fashion and the wafer W can be smoothly conveyed to the subsequent process chamber. As a result, the through-put can be enhanced.

The direction of arrangement of the first transfer chamber 16, intermediate path chamber 38 and second transfer chamber 30 is at right angles with the direction of arrangement of each process unit 12A, 12B. Thus, compared to the conventional cluster-tool-type process system shown in FIG. 18, the layout at the time of assembly is easier.

Figure 2:
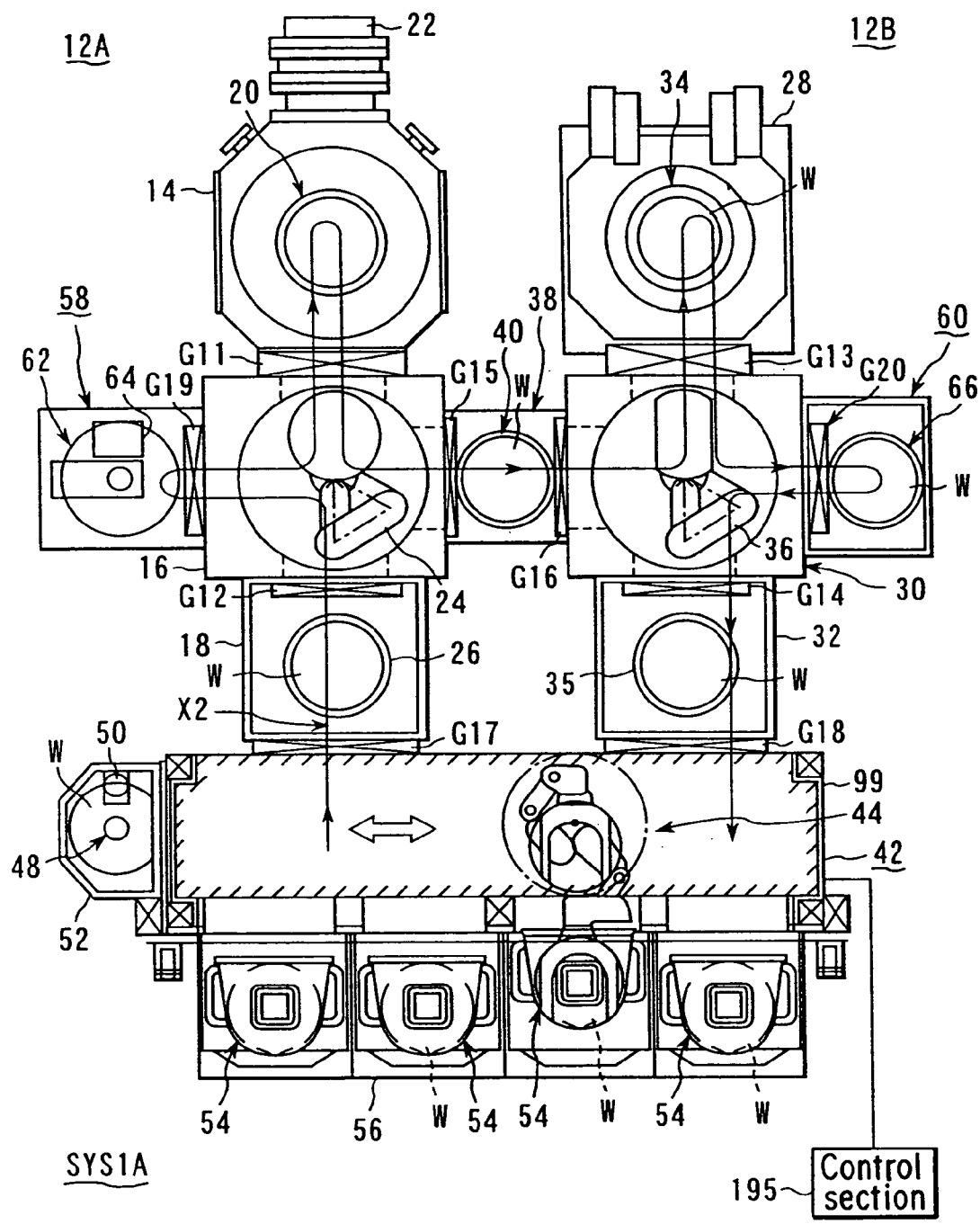
FIG. 2 is a schematic view showing the structure of a vacuum process system according to a second embodiment of the present invention.

In the first embodiment, only the sputter process chamber 14 and CVD process chamber 28 are connected to the first transfer chamber 16 and second transfer chamber 30, respectively. This invention, however, is not limited to this structure. For example, an aligning/preheating chamber and a cooling chamber may be connected. FIG. 2 shows a vacuum process system having such a structure as a second embodiment of the present invention. The parts common to those in the first embodiment of FIG. 1 are denoted by like reference numerals and a description thereof is omitted.

As is shown in FIG. 2, in a vacuum process system SYSLA of this embodiment, an aligning/preheating chamber 58 capable of $N_2$ purge and evacuation is coupled to a side wall of the first transfer chamber 16 via an air-tightly openable/closable gate valve G19. A cooling chamber 60 capable of $N_2$ purge and evacuation is coupled to a side wall of the second transfer chamber 30 via an air-tightly openable/closable gate valve G20. The aligning/preheating chamber 58 is provided with a rotary table 62 that is rotatable and equipped with a heater, and an optical sensor 64, thereby to preheat and align the wafer W at the same time.

In this case, the alignment chamber 52 of the transfer stage 42 can be dispensed with, and the preheating in the first load lock chamber 18 can be omitted.

The cooling chamber 60 includes a cooling table 66 for cooling the wafer W.

In this case, a transfer path indicated by arrow X2 is adopted as the transfer path for the wafer W. Specifically, the wafer W, which has not yet been aligned, is transferred by the transfer arm 24 from the first load lock chamber 18 into the aligning/preheating chamber 58, and both the alignment and preheating of the wafer W are performed. The wafer W is then taken out by the transfer arm 24 and guided into the sputter process chamber 14 for sputtering. A Ti/TiN film is formed in the same manner as described above.

As in the first embodiment, the wafer W on which the film has been formed is transferred into the second transfer chamber 30 by opening and closing both gate valves G15, G16 of the intermediate path chamber 38 and maintaining isolation between the first and second transfer chambers 16, 30 while preventing movement of gas flow. The wafer W is then introduced into the CVD process chamber 28 and the same CVD film formation process, as described in the first embodiment, is carried out. Furthermore, the wafer W is taken out of the CVD process chamber 28 by the transfer arm 36 and conveyed into the cooling chamber 60. After the gate valve G20 is closed, the wafer W is cooled. Subsequently, the wafer W is drawn out of the cooling chamber 60 and, like the first embodiment, it is returned to the cassette container 54 through the second load lock chamber 32. In this case, the cooling in the second load lock chamber 32 can be omitted.

As has been described above, in the second embodiment, the same advantages as with the first embodiment can be obtained. Specifically, since the transfer path of the wafer W is simplified and not crossed, the wafer W can be efficiently transferred and the through-put can be enhanced. Furthermore, when the wafer W is transferred from the first transfer chamber 16 to the second transfer chamber 30, direct communication between both the chambers 16, 30 is prevented. Therefore, the metal film-formation gas is prevented from moving between both chambers 16, 30 and metal contamination can be prevented.

Figure 3:
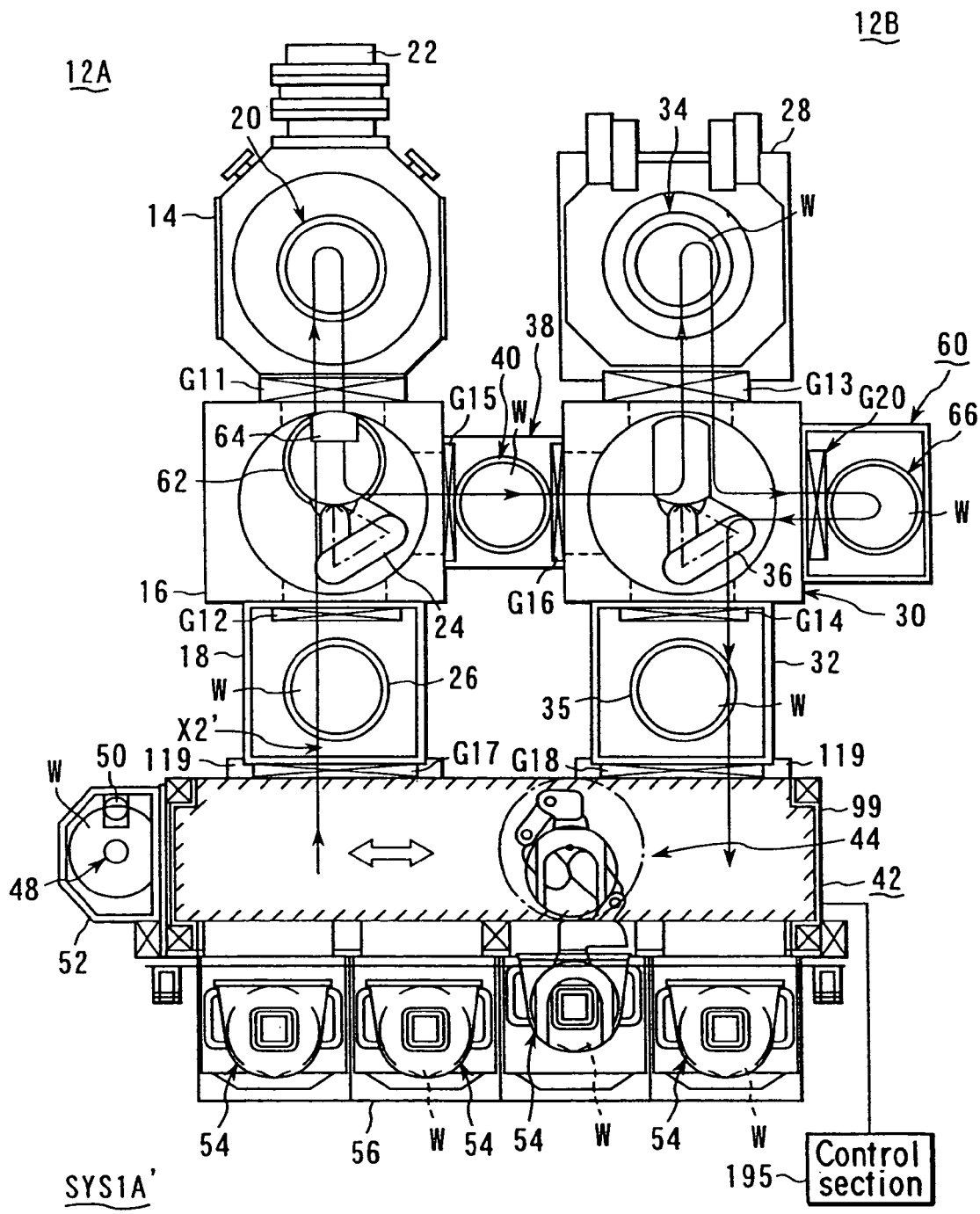
FIG. 3 is a schematic view showing the structure of a vacuum process system according to a third embodiment of the present invention.

FIG. 3 shows a third embodiment of the present invention. In a vacuum process system SYS1A' of this embodiment, the rotary table 62, which is rotatable and equipped with the heater, and the optical sensor 64 are provided in the first transfer chamber 16, whereby the wafer W is preheated and aligned at the same time. Each process unit 12A, 12B constitutes one module. Specifically, the process chamber 14, transfer chamber 16 and load lock chamber 18 are integrated to form one module. On the other hand, the process chamber 28, transfer chamber 30 and load lock chamber 32 are integrated to form one module. Each process unit (module) 12A, 12B is detachably attached to the process-object transfer stage 42 via a coupling section 119.

According to this embodiment, the wafer W is processed along substantially the same transfer path X2' as in the first embodiment, and thus the same operational advantage as in the first embodiment can be obtained. When maintenance for the process unit 12A (12B) is to be conducted, the process unit 12A (12B) can be separated from the process-object transfer stage 42 by means of the coupling section 119 and moved to a desired location. Thus, there is no need to provide a gap between the process units 12A, 12B for the maintenance. As a result, the system can be reduced in size and manufacturing cost.

In the first to third embodiments, films containing different metal components are formed in the two process chambers 14, 28. In order to prevent occurrence of metal contamination, the gates G15, G16 are provided on both sides of the intermediate path chamber 38, thereby preventing direct communication between both transfer chambers 16, 30. For example, where the same gas components for film formation are used in both process chambers 14, 28 and there is no possibility of metal contamination, the gate valves G15, G16 may be dispensed with and the first and second transfer chambers 16, 30 and intermediate path chamber 38 may be made to communicate with one another.

Figure 4:
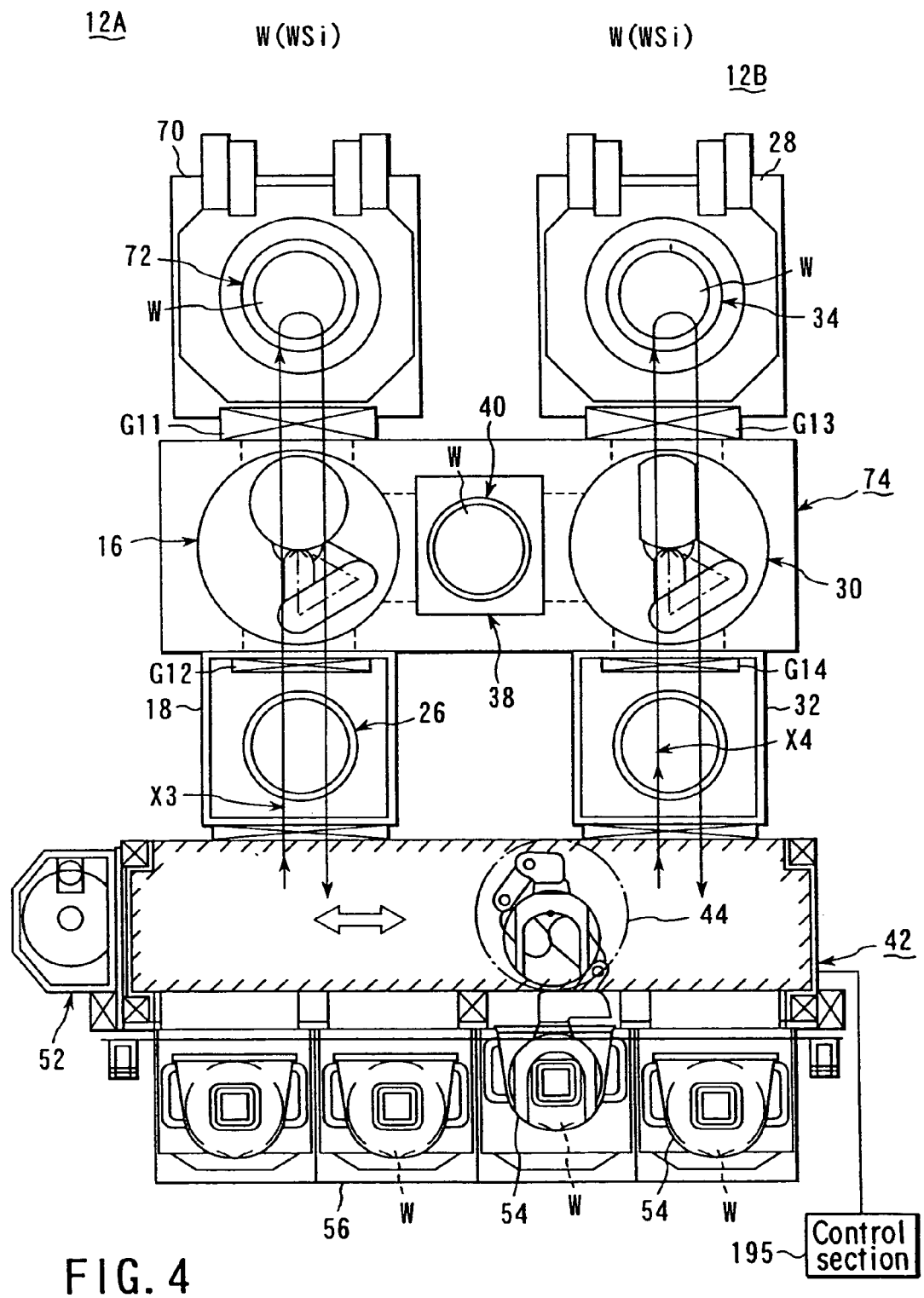
FIG. 4 is a schematic view showing the structure of a modification of the vacuum process system shown in FIG. 3.

FIG. 4 schematically shows the structure of an example of such a vacuum process system. The parts common to those in the first embodiment of FIG. 1 are denoted by like reference numerals, and a description thereof is omitted.

In the structure shown in FIG. 4, the sputter process chamber 14 in FIG. 1 is replaced with a CVD process chamber 70. In the CVD process chamber 70, for example, a metal tungsten film is formed using the same film-formation gas that the adjacent CVD process chamber 28 uses in forming a metal tungsten film. Reference numeral 72 denotes a susceptor for mounting of the wafer W. In this case, since the same gas components are used in both the process chambers 28, 70, there is no possibility of metal contamination. Accordingly, in this example, the gate valves G15, G16 used in the embodiment of FIG. 1 are not provided, and the first transfer chamber 16, intermediate path chamber 38 and second transfer chamber 30 are integrated to communicate with one another. Specifically, a large transfer container 74 including the three chambers 16, 38, 30 is formed. In this case, there is no need to provide each of the three chambers 16, 38, 30 with an exhaust system including a vacuum pump, and it should suffice to provide the transfer chamber 74 with one exhaust system. Therefore, the cost can be reduced. The material of the film to be formed on the wafer W in the process chamber 28, 70 is not limited to tungsten, and it may be tungsten silicide (WSi), for instance.

The transfer paths of the wafer W in this example are indicated by arrows X3 and X4. Processes are independently carried out in the process units 12A, 12B, and the wafer W is not transferred through the intermediate path chamber 38.

Figure 5:
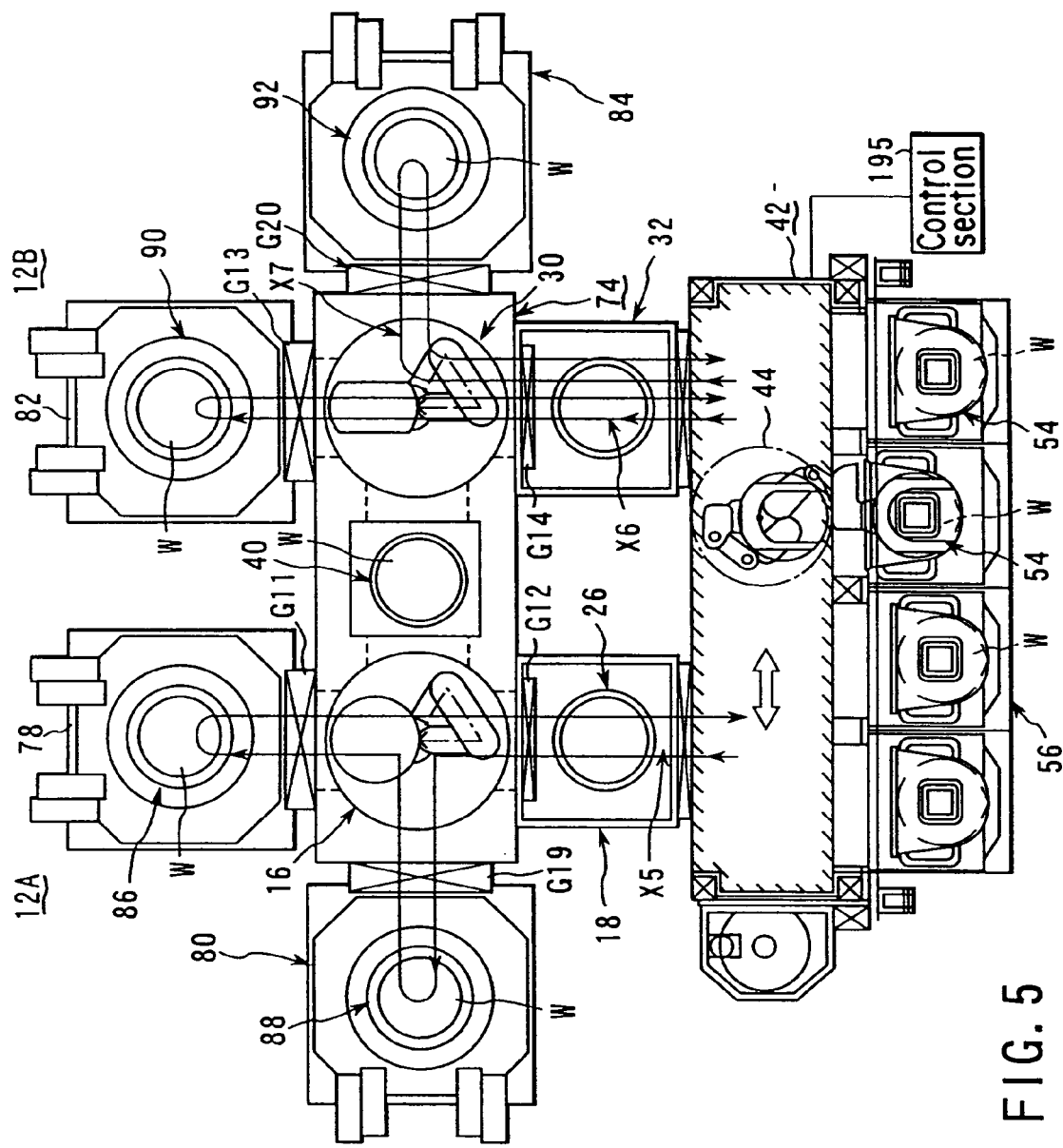
FIG. 5 is a schematic view showing the structure of a modification of the vacuum process system shown in FIG. 4.

FIG. 5 shows another example of the vacuum process system, with which there is no need to consider metal contamination. The structural parts common to those in FIG. 4 are denoted by like reference numerals, and a description thereof is omitted.

In the structure shown in FIG. 5, four process chambers are used in total. Films free from metal contamination, for example, a titanium (Ti) film and a titanium nitride (TiN) film, are formed on the wafer W. A CVD process chamber 78 for forming a TiN film by CVD and a CVD process chamber 80 for forming a Ti film by CVD are connected to the first transfer chamber 16 via the gate valve G11 and a gate valve G19. On the other hand, a CVD process chamber 82 for forming a TiN film by CVD and a CVD process chamber 84 for forming a Ti film by CVD are connected to the second transfer chamber 30 via the gate valve G13 and a gate valve G20. Needless to say, in this case, too, there is no possibility of metal contamination, and the first and second transfer chambers 16, 30 and the intermediate path chamber 38 are made to communicate with one another without gate valves. Reference numerals 86, 88, 90, 92 denote susceptors provided in the respective process chambers.

In the first process unit 12A, the wafer W is transferred along a transfer path indicated by arrow X5 since the Ti film and TiN film are successively formed in a stacked fashion. In the second process unit 12B, the wafers W are transferred along transfer paths indicated by arrows X6 and X7 since the Ti film and TiN film are independently formed as single layers. Specifically, in the transfer path indicated by arrow X5, the wafer W is conveyed into the Ti-film CVD process chamber 80 and the Ti film is formed. Then, the wafer W is conveyed into the TiN-film CVD process chamber 78 and the TiN film is formed. The processed wafer W is returned to the associated cassette container.

In the transfer path indicated by arrow X6, the wafer W is conveyed into the TiN-film CVD process chamber 82 and the TiN film is formed. The processed wafer W is returned to the associated cassette container. In the transfer path indicated by arrow X7, the wafer W is conveyed into the Ti-film CVD process chamber 84 and the Ti film is formed. The processed wafer W is returned to the associated cassette container.

As has been described above, in accordance with films to be required, two kinds of films, for instance, may be serially and successively formed, or they may be simultaneously formed in parallel.

Figure 6:
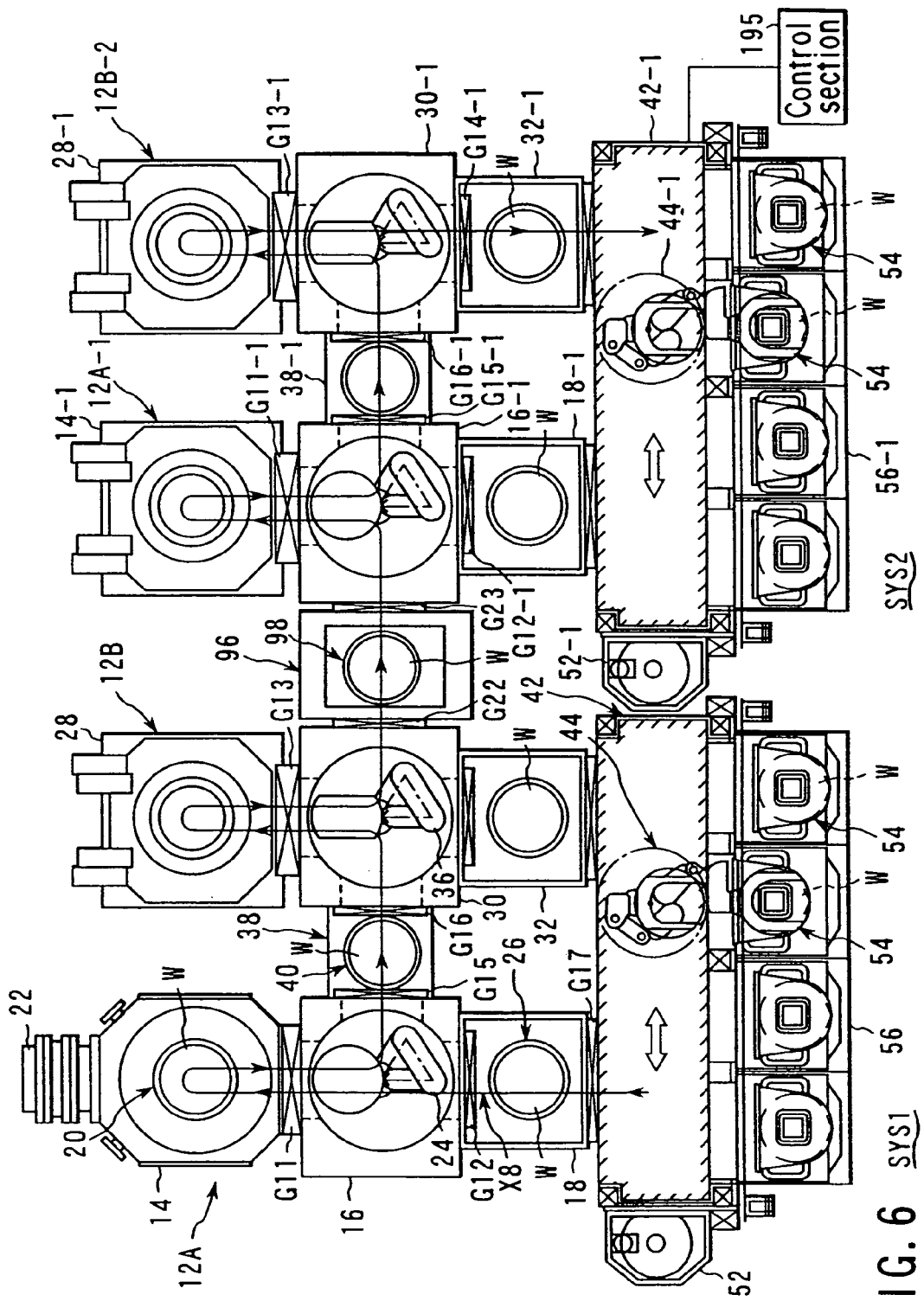
FIG. 6 is a schematic view showing the structure of a vacuum process system according to a fourth embodiment of the present invention.

FIG. 6 schematically shows the structure of a vacuum process system according to a fourth embodiment of the present invention. In this embodiment, plural sets of the systems according to the first embodiment shown in FIG. 1 are disposed in parallel. In this embodiment, for example, two sets of the systems are provided in parallel and are coupled via an inter-system path chamber 96. Specifically, the vacuum process system SYS1 with the structure shown in FIG. 1 is flanked, on the right side, by a second vacuum process system SYS2 having the same structure as the vacuum process system SYS 1 except that the sputter process chamber 14 is replaced with a CVD process chamber 14-1. The components of the second vacuum process system SYS2, which correspond to those of the first vacuum process system SYS1 are denoted by like numerals with addition of common numeral "-1" at the end.

In order to juxtapose the first vacuum process system SYS1 and second vacuum process system SYS2, the inter-system path chamber 96 is interposed between the second transfer chamber 30 of the first vacuum process system SYS1 and the adjacent first transfer chamber 16-1 of the second vacuum process system SYS2. The inter-system path chamber 96 is capable of $N_2$ purge and evacuation and includes a table 98 for mounting of the wafer W.

Air-tightly openable/closable gate valves G22 and G23 are interposed between the inter-system path chamber 96, on the one hand, and the second transfer chamber 30 and first transfer chamber 16-1, on the other hand, which stand on both sides. Accordingly, the wafer W can be transferred or moved between the first and second vacuum process systems SYS1, SYS2 via the inter-system path chamber 96.

An example of the transfer path of the wafer W in this embodiment is indicated by arrow X8. Specifically, films are successively formed on the wafer W in the sputter process chamber 14 and CVD process chamber 28 of the first vacuum process system SYS1. The wafer W is then transferred to the second vacuum process system SYS2 via the inter-system path chamber 96. Further, films are successively formed on the wafer W in one CVD process chamber 14-1 and the other CVD process chamber 28-1 of the system SYS2.

According to this embodiment, plural kinds of films, which may cause metal contamination, can be successively formed without metal contamination. Moreover, since the transfer path is simplified, the transfer path is not crossed and efficient transfer is performed. Therefore, the throughput can be enhanced.

In the structures shown in FIGS. 1–6, the devices (transfer devices, etc.) for transferring the wafer W along the predetermined transfer path are controlled by a control section 195. The number of systems or units connected to the common transfer chamber is not limited to those in the respective embodiments. More systems or units may be coupled. The transfer path in each embodiment is indicated only by way of example. A proper transfer path is determined on the basis of the kinds of films formed in the coupled process chambers, the order of thin films to be stacked, etc. The process performed in the process chamber is not limited to a film formation process, and it may be an etching process, an annealing process, an ashing process, a sputtering process, etc. As the object to be processed, the semiconductor wafer is used by way of example. However, it may be a glass substrate, an LCD substrate, etc.

Figure 7:
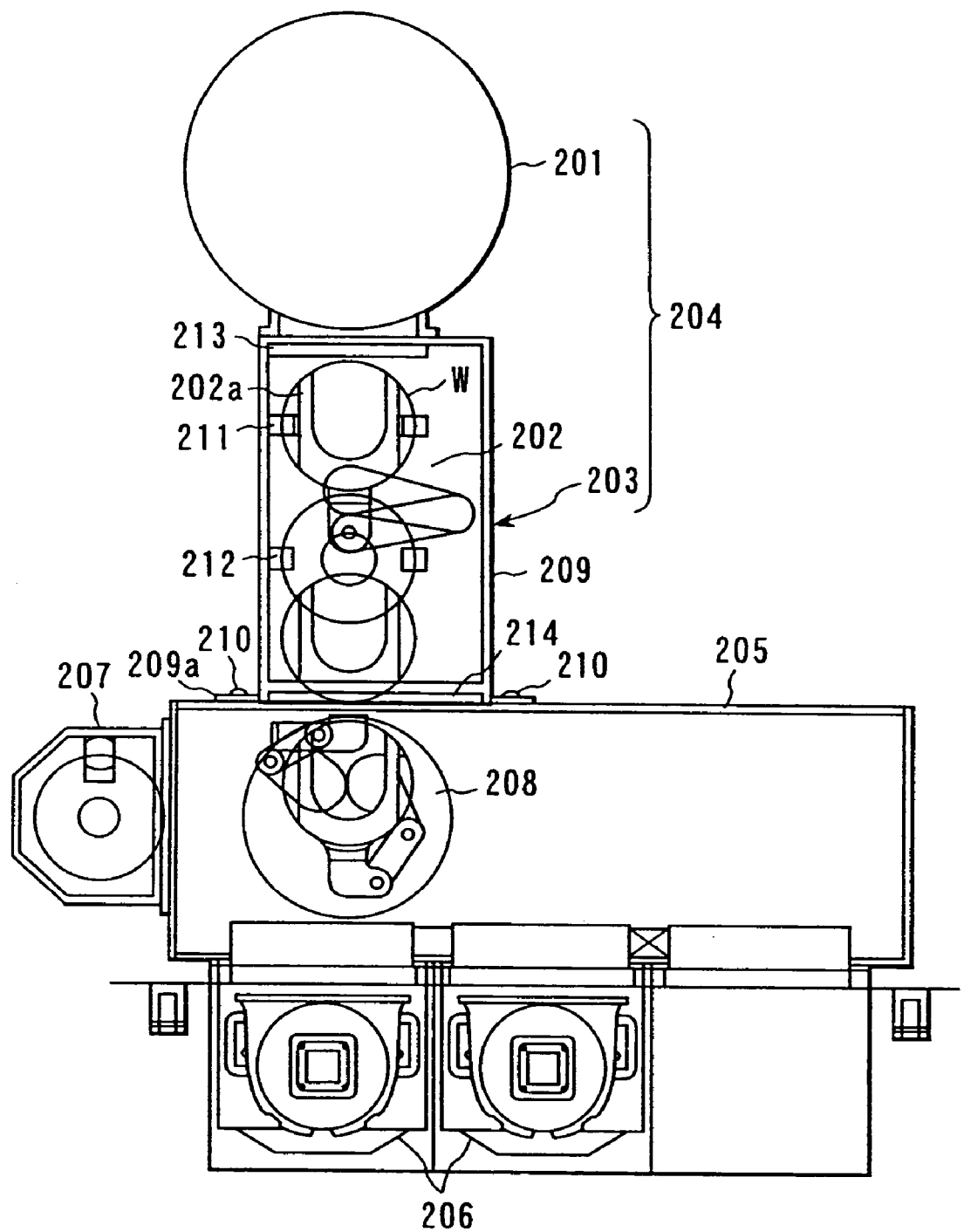
FIG. 7 is a schematic view showing the structure of an example of a vacuum process unit which is detachably attached to a shared transfer chamber.
Figure 8:
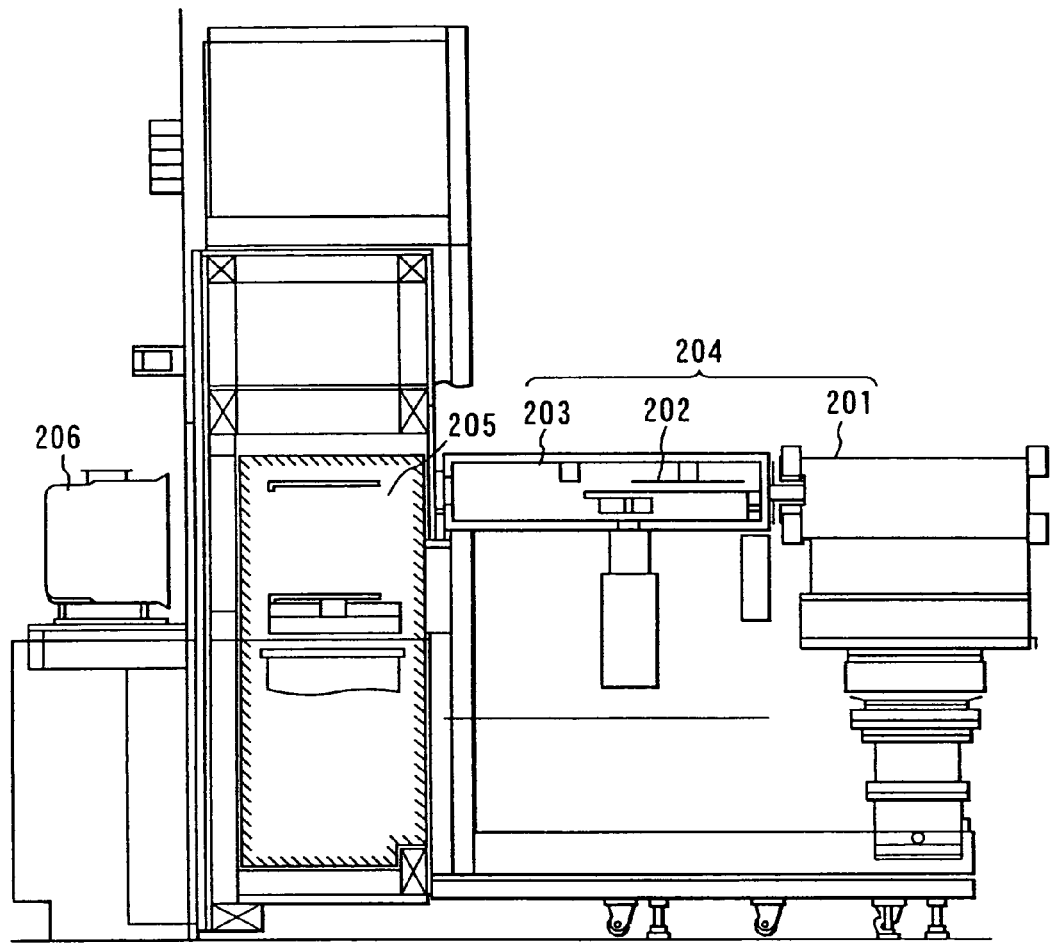
FIG. 8 is a side view of the vacuum process unit shown in FIG. 7.

FIGS. 7 and 8 show an example of a vacuum process system having a vacuum transfer chamber 203 wherein the load lock chamber 18 (see FIG. 1) and the transfer chamber 16 (see FIG. 1) are integrated. Specifically, FIG. 7 is a schematic plan view of the vacuum process system for etching a semiconductor wafer, or an object to be processed, and FIG. 8 is a side view thereof. The vacuum process system comprises a vacuum process chamber 201 for etching the wafer W; a vacuum transfer chamber 203 including a scalar-type single-pick transfer arm 202 serving as a transfer device for transferring the wafer W to/from the vacuum process chamber 201; and a transfer chamber (with the inside set at an atmospheric pressure level) 205 serving as a rectangular common transfer chamber. The vacuum process chamber 201 and the vacuum transfer chamber 203 including the transfer arm 202 constitute one module (process unit) 204 that is detachably attached to one side of the transfer chamber 205. In addition, the other side of the transfer chamber 205 is provided with plural wafer cassettes 206 juxtaposed on a load port. Each wafer cassette 206 serves as container means for containing several-ten wafers W at predetermined intervals. A pre-alignment stage 207 is provided at one end of the transfer chamber 205.

In addition, the transfer chamber 205 is provided with a scalar-type dual-arm transfer arm mechanism (transfer device) 208 for transferring the wafer W to/from the wafer cassette 206. The arm mechanism 208 is movable in the longitudinal direction of the transfer chamber 205.

According to this structure, one wafer W taken out of the wafer cassette 206 by means of the transfer arm mechanism 208 is conveyed into the pre-alignment stage 207 and pre-aligned. The wafer W is then held by the transfer arm mechanism 208 and conveyed into the vacuum transfer chamber 203. The wafer W conveyed into the vacuum transfer chamber 203 is received by the transfer arm 202 and conveyed into the vacuum process chamber 201.

The wafer W etched in the vacuum process chamber 201 is transferred into the vacuum transfer chamber 203 by the transfer arm 202. Then, the processed wafer W is delivered to the transfer arm mechanism 208. The transfer arm mechanism 208 returns the wafer W to the wafer cassette 206.

For example, a flange portion 209a is integrally formed at that end portion of a casing 209 of the transfer chamber 203, which faces the transfer chamber 205. The flange portion 209a is attached to an outer wall of the transfer chamber 205 by means of a plurality of bolts 210. Accordingly, the module 204 can be detachably attached to the transfer chamber 205 by loosening and tightening the bolts 210.

The transfer arm 202 is disposed at a substantially central part of the inside of the vacuum transfer chamber 203. A first buffer 211 is provided on the vacuum process chamber 201 side of the rotational axis of the transfer arm 202. A second buffer 212 is provided on the transfer chamber 205 side of the rotational axis of the transfer arm. More specifically, the first and second buffers 211, 212 are disposed on the locus of a support portion 202a for supporting the wafer W, which is provided at a distal end portion of the transfer arm 202. The first and second buffers 211, 212 rise to receive the wafer W from the support portion 202a, and lower to place the wafer W onto the support portion 202a.

A vacuum-side gate valve 213 is provided at a coupling portion between the vacuum process chamber 201 and vacuum transfer chamber 203. An atmosphere-side gate valve 214 is provided at a coupling portion for coupling with the transfer chamber 205.

The transfer arm 202 will now be described in greater detail with reference to FIGS. 9A to 10K.

Figures 9A, 9B:
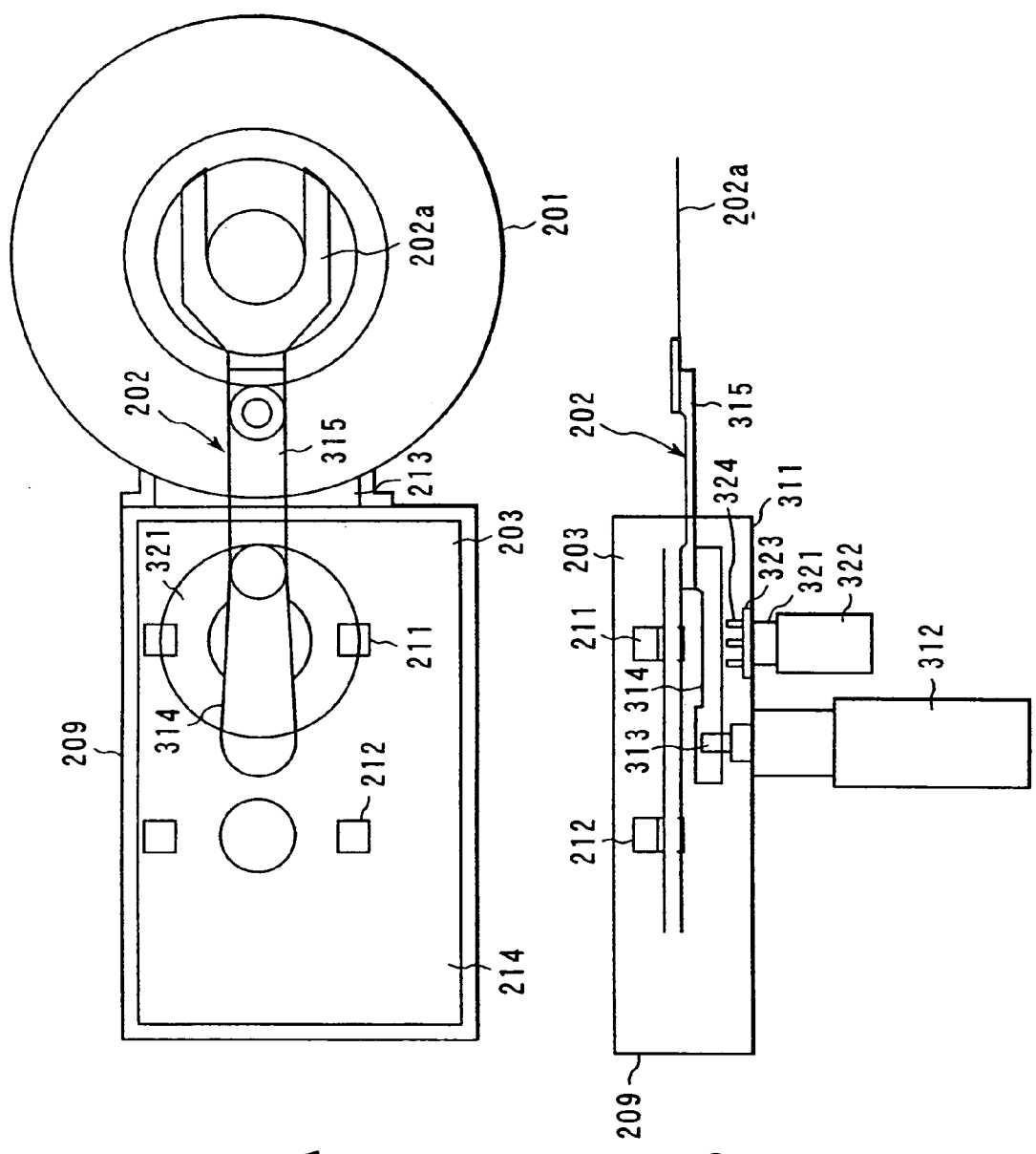
FIG. 9A is a plan view of a transfer arm provided in a vacuum transfer chamber of the vacuum process unit shown in FIG. 7.
FIG. 9B is a side view of the transfer arm shown in FIG. 9A.

As is shown in FIGS. 9A and 9B, a rotary drive section 312 such as a forward/reverse rotatable motor is vertically fixed to a base 311, or a bottom part, of the vacuum transfer chamber 203. A rotary drive shaft 313 of the rotary drive section 312 projects into the inside of the vacuum transfer chamber 203. A proximal end portion of a driving-side rotational arm 314 is fixed to the rotary drive shaft 313.

A proximal end portion of a driven-side rotational arm 315 is rotatably coupled to a distal end portion of the driving-side rotational arm 314. The forked support portion 202a for supporting the wafer W is coupled to a distal end portion of the driven-side rotational arm 315 in a horizontally rotational manner. With the rotational movement of the driving-side rotational arm 314, the driven-side rotational arm 315 and support portion 202a are rotated as one body. With the rotation of the driven-side rotational arm 315, the support portion 202a is advanced and retreated with its attitude maintained.

A pre-alignment mechanism 321 for pre-aligning the wafer W is provided at a position facing the first buffer 211. The pre-alignment mechanism 321 comprises a disk 323, which is vertically moved and rotated by a vertical-movement/rotation drive section 322 provided at the base 311 of the vacuum transfer chamber 201, and a plurality of pins 324 vertically projecting from the disk 323. The pins 324 horizontally supports and pre-aligns the wafer W.

An example of the operation of the transfer arm will now be described with reference to FIGS. 10A to 10K.

FIG. 10A shows a state in which the wafer W is being etched in the vacuum process chamber 201. In this state, the vacuum-side gate valve 213 is closed and the transfer arm 202 stands by in the vacuum transfer chamber 203. FIG. 10B shows a state in which the etching process for the wafer W is completed, the wafer W is raised by lifter pins (not shown), and the vacuum-side gate valve 213 is opened. FIG. 10C shows a state in which the processed wafer W is taken out of the vacuum process chamber 201. In this case, if the support portion 202a of the transfer arm 202 advances to a point below the wafer W within the vacuum process chamber 201, the lifter pins lower and the wafer W is placed on the support portion 202a. In addition, the vertical movement shaft of the second buffer 212 lowers, the buffer pins stand by at a lower position, and the support portion 202a of the transfer arm 202 retreats. FIG. 10D shows a state in which the processed wafer W is taken out of the vacuum process chamber 201 and transferred into the vacuum transfer chamber 203. If the wafer W supported on the support portion 202a is positioned above the second buffer 212 in this way, the buffer pins rise and receive the wafer W from the support portion 202a, thus supporting the wafer W. FIG. 10E shows a state in which the support portion 202a of the transfer arm 202 has advanced within the vacuum transfer chamber 203. FIG. 10F shows a state in which the support portion 202a of the transfer arm 202 is positioned below the first buffer 211. In this state, the vertical movement shaft lowers and the wafer W to be processed, which is supported by the buffer pins, is supported on the support portion 202a. FIG. 10G shows a state in which the wafer W to be processed is conveyed into the vacuum process chamber 201. If the support portion 202a of the transfer arm 202 advances and reaches above the lower electrode, the lifter pins rise and receive the wafer W from the support portion 202a. Then, if the support portion 202a of the transfer arm 202 retreats, the vacuum-side gate valve 213 is closed. FIG. 10H shows a state in which the etching process is performed in the vacuum process chamber 201, the inside of the vacuum transfer chamber 203 is set at an atmospheric pressure level by the supply of $N_2$ gas, and the atmosphere-side gate valve 214 is opened. FIG. 10I shows a state in which, following the opening of the atmosphere-side gate valve 214, the processed wafer W is taken out of the vacuum transfer chamber 203 and the to-be-processed wafer W is introduced into the vacuum transfer chamber 203. If the to-be-processed wafer W is supported on the second buffer 212, the atmosphere-side gate valve 214 is closed. FIG. 10J shows a state in which the vacuum transfer chamber 203 is evacuated, the support portion 202a of the transfer arm 202 retreats, and the buffer pins of the first and second buffers 211, 212 are lowered. FIG. 10K shows a state in which the support portion 202a of the transfer arm 202 advances and the buffer pins of the second buffer 212 are raised. If the etching process is completed in the vacuum process chamber 201 during this time, the operation is repeated from the state shown in FIG. 10A.

If the scalar-type single-pick transfer arm 202 is provided in the vacuum transfer chamber 203, the structure of the transfer system can be simplified. In addition, the wafer W is transferred into/from the vacuum transfer chamber 203 by the linear movement of the support portion 202a, which is caused by the advancement/retreat movement of the transfer arm 202 (the wafer W can be transferred only by the advancement/retreat movement of the support portion 202a without rotation of the support portion 202a). Thus, the size of the vacuum transfer chamber 203 can be reduced. Since the pre-alignment mechanism 321 is disposed at the position facing the first buffer 211 within the vacuum transfer chamber 203, the wafer W can be pre-aligned immediately before it is introduced into the vacuum process chamber 201. Thus, the wafer W can be conveyed into the vacuum process chamber 201 with high precision.

The operation of the vacuum process system with the above structure will now be described. In the steps to be described below, the procedure for transferring the wafer W to/from the buffer 211, 212 by means of the transfer arm 202 is slightly different from that illustrated in FIGS. 10A to 10K.

To begin with, one wafer W is taken out of the wafer cassette 206 by means of the transfer arm mechanism 208. The wafer W is then conveyed into the pre-alignment stage 207 and pre-aligned. The wafer W is held by the transfer arm mechanism 208 once again and conveyed into the vacuum transfer chamber 203. In the vacuum transfer chamber 203, the wafer W is placed on the second buffer 212 by means of the transfer arm mechanism 208. The vacuum-side gate valve 213 is opened, and the to-be-processed wafer W on the second buffer 212 is introduced into the vacuum process chamber 201 by means of the support portion 202a of the transfer arm 202. Subsequently, the vacuum-side gate valve 213 is closed and the wafer W is etched within the vacuum process chamber 201. During this time, the atmosphere-side gate valve 214 is opened and a wafer W to be next processed is transferred onto the second buffer 212 by means of the transfer arm mechanism 208. If the etching process in the vacuum process chamber 201 is completed, the vacuum-side gate valve 213 is opened and the processed wafer W in the vacuum process chamber 201 is transferred onto the first buffer 211 by the support portion 202a of the transfer arm 202. Thereafter, the transfer arm 202 introduces the to-be-processed wafer W, which stands by on the second buffer 212, into the vacuum process chamber 201. If the vacuum-side gate valve 213 is closed for the etching process in the vacuum process chamber 201, the transfer arm 202 transfers the processed wafer W on the first buffer 211 onto the second buffer 212. If the atmosphere-side gate valve 214 is then opened, the transfer arm mechanism 208 receives the processed wafer W from the second buffer 212 and returns it to the wafer cassette 206. These steps are repeated to successively subject wafers W to etching.

As has been described above, according to the structure shown in FIGS. 7 and 8, the vacuum process chamber 201 and the vacuum transfer chamber 203 are independently provided in a 1-to-1 relationship. Thus, there is no fear of cross-contamination, and the reliability is enhanced. When maintenance needs to be conducted for the module 204, the module 204 can be separated from the transfer chamber 205 by loosening the bolts 210. The module 204 can be moved to a desired place for maintenance work. Needless to say, during the maintenance, another module 204 may be attached to the transfer chamber 205 to continue the process.

Figure 11:
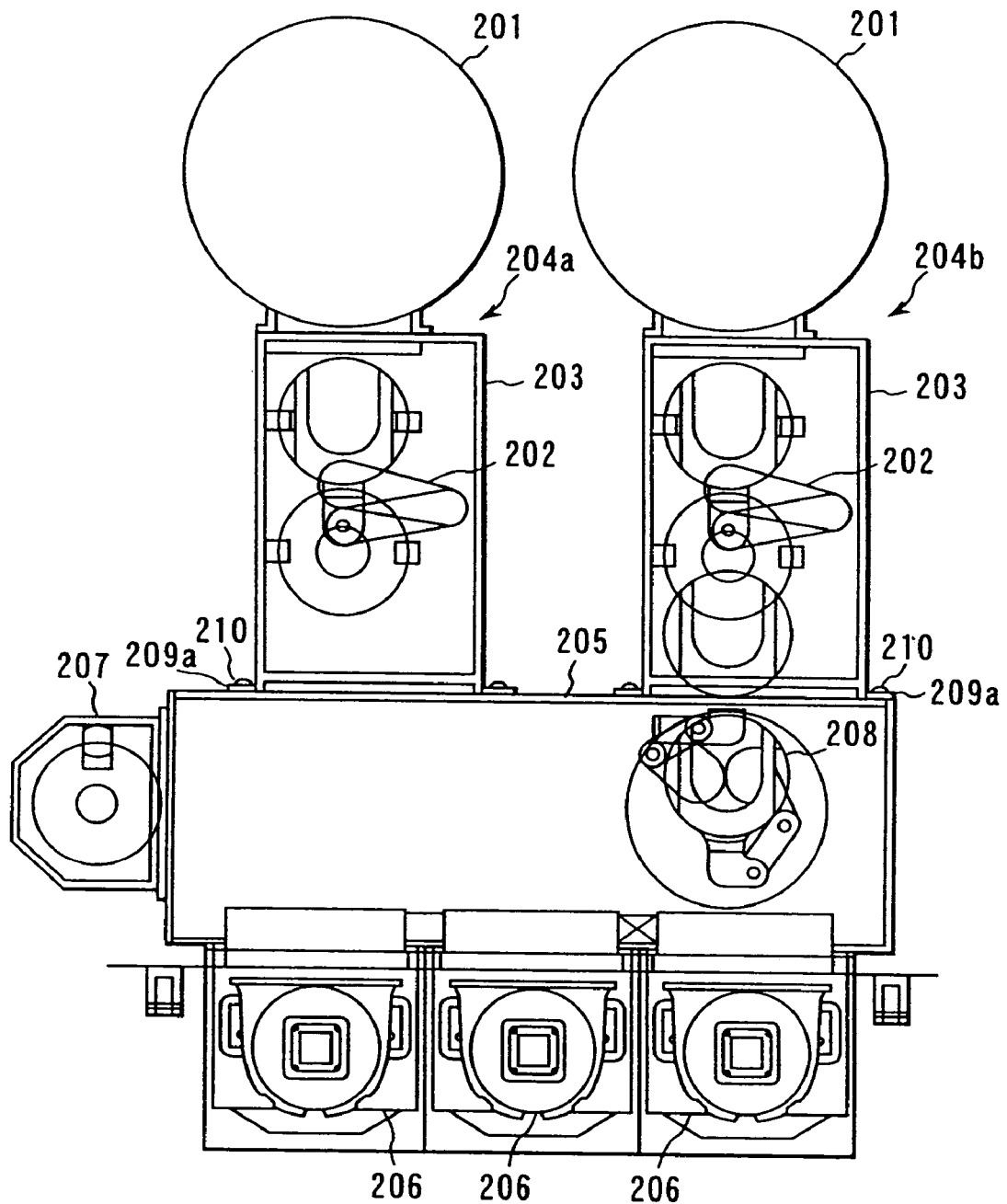
FIG. 11 is a schematic view showing the structure of a vacuum process system according to a fifth embodiment of the present invention.

FIG. 11 shows a fifth embodiment of the present invention. This embodiment is a modification of the structure shown in FIGS. 7 and 8. The structural parts common to those in FIGS. 7 and 8 are denoted by like reference numerals and a description thereof is omitted.

In this embodiment, two modules 204a and 204b, each comprising the vacuum process chamber 201 and the vacuum transfer chamber 203 including the transfer arm 202, are detachably attached to the transfer chamber 205 in a juxtaposed fashion.

As has been described above, in this embodiment, each module 204a, 204b comprises the process chamber 201 and the associated vacuum transfer chamber 203 and is individually connected to the common transfer chamber 205. In other words, the plural process-completion type modules 204a, 204b, in each of which the process chamber and vacuum transfer chamber are provided in a 1-to-1 relationship, are individually connected to the common transfer chamber 205. Accordingly, the flow of gas between the modules 204a, 204b can be prevented. That is, metal contamination between the modules 204a, 204b can be prevented (cross-contamination can be prevented). In addition, while the process is being performed in one module 204a, the process can be performed in the other module 204b and the through-put can be enhanced.

In the present embodiment, the modules 204a, 204b are arranged in parallel in a direction perpendicular to the longitudinal direction of the transfer chamber 205 (in the direction of movement of the arm mechanism 208). The wafer W introduced from the transfer chamber 205 into each module 204a, 204b is conveyed along the linear transfer path in the module 204a, 204b and processed. Accordingly, the transfer path of the wafer W is not crossed in a complex manner, and the wafer W is smoothly transferred to the next process chamber. As a result, the through-put can be enhanced.

In this embodiment, since the modules 204a, 204b are detachably attached to the transfer chamber 205 and are separable, there is no need to provide a space for maintenance between the modules 204a, 204b. Accordingly, the whole apparatus (footprint) can be reduced, and the manufacturing cost of the apparatus can be decreased. Needless to say, when one module 204a is moved to a given place for maintenance, the process can be performed using the other module 204b. In this respect, too, the productivity can be enhanced.

Figure 12:
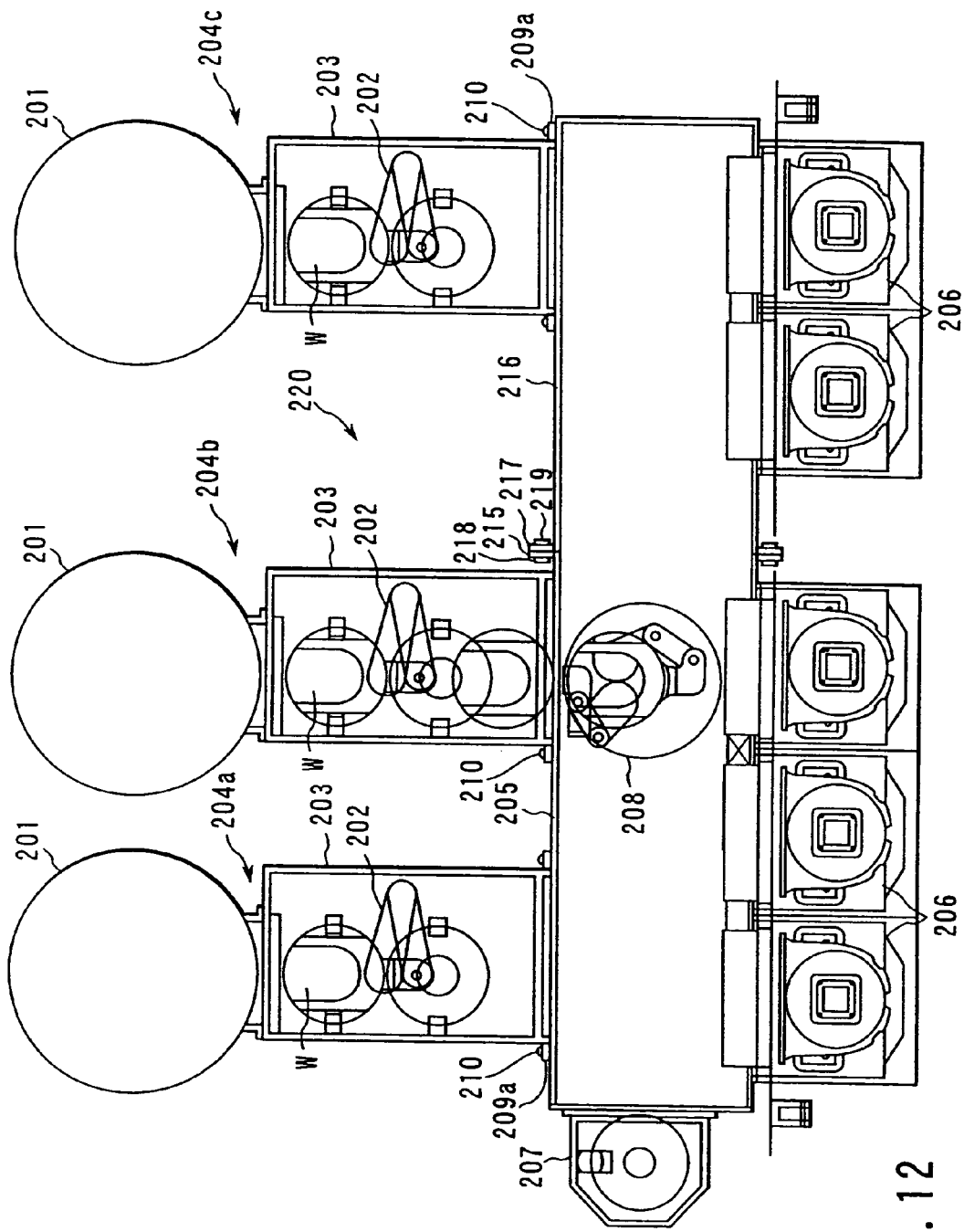
FIG. 12 is a schematic view showing the structure of a vacuum process system according to a sixth embodiment of the present invention.

FIG. 12 shows a sixth embodiment of the present invention. This embodiment is a modification of the fifth embodiment. The structural parts common to those in the fifth embodiment are denoted by like reference numerals and a description thereof is omitted.

In this embodiment, the transfer chamber 205 is extended, and three modules 204a, 240b, 240c, each comprising the vacuum process chamber 201 and the vacuum transfer chamber 203 including the transfer arm 202, are detachably attached to the transfer chamber 205 in a juxtaposed fashion.

Specifically, a flange portion 215 is integrally provided at one end portion of the transfer chamber 205, and another flange portion 217 is integrally provided at one end portion of an extension transfer chamber 216. The flange portions 215 and 217 are detachably coupled by means of bolts 218 and nuts 219. Two modules 204a, 204b are detachably attached to the transfer chamber 205, and one module 204c is detachably attached to the extension transfer chamber 216. Besides, the transfer arm mechanism 208 is movable over the range of the transfer chamber 205 and extension transfer chamber 216.

Accordingly, in the present embodiment, the same operational advantages as with the fourth embodiment can be obtained. Since a module can easily be additionally provided on an as-needed basis, the initial cost can be suppressed to a minimum.

A wide maintenance space 220 may be provided between the module 204b and module 204c. With the provision of the space 220, a maintenance work may be conducted for the module 204b, 204c without detaching/attaching the module 240b, 240c from/to the transfer chamber 205.

Figure 13:
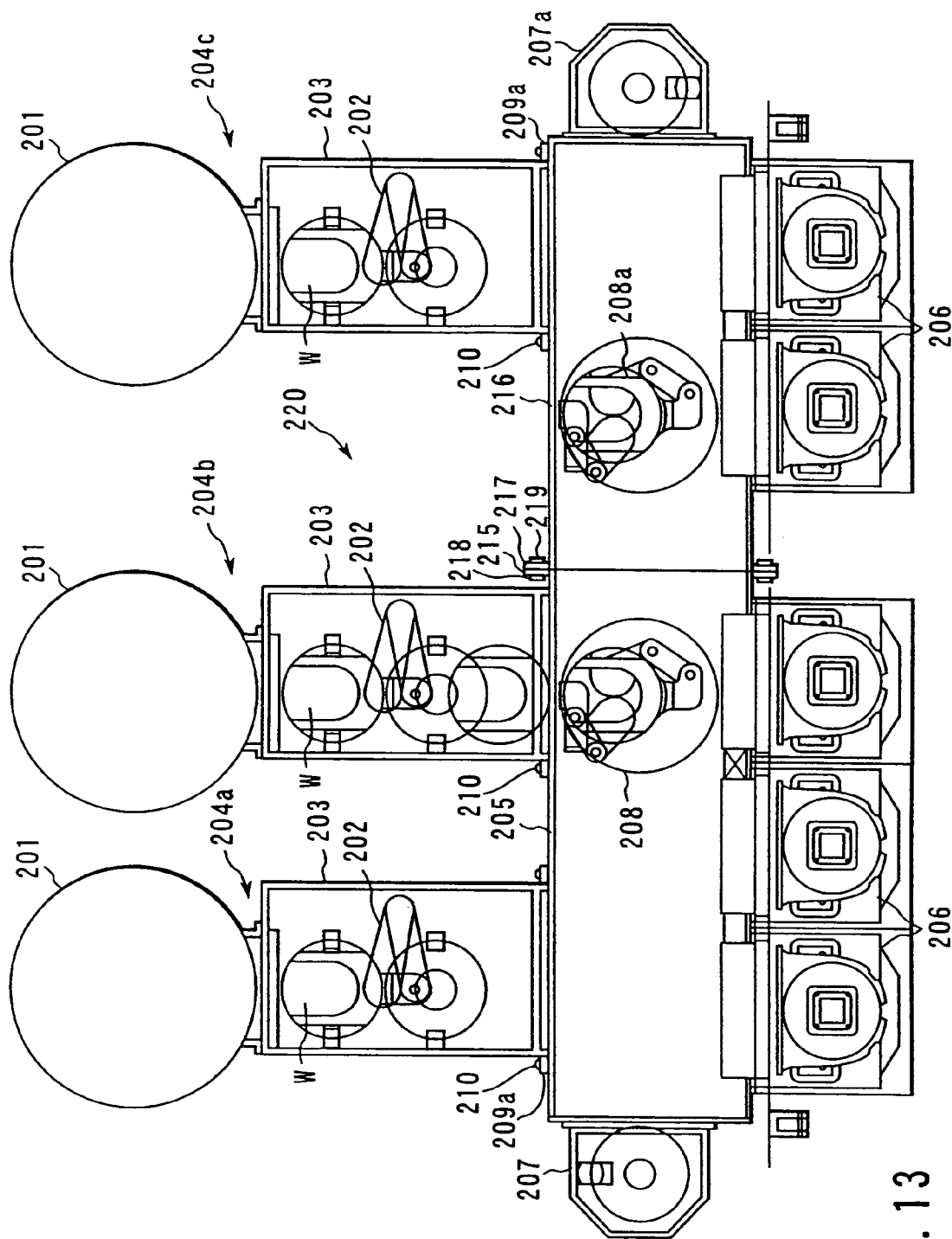
FIG. 13 is a schematic view showing the structure of a vacuum process system according to a seventh embodiment of the present invention.

FIG. 13 shows a seventh embodiment of the present invention. This embodiment is a modification of the sixth embodiment. The structural parts common to those in the sixth embodiment are denoted by like reference numerals and a description thereof is omitted.

In this embodiment, a transfer arm mechanism 208a is additionally provided in the extension transfer chamber 216. The extension transfer chamber 216 is provided with a pre-alignment stage 207a. Accordingly, when a trouble has occurred in the transfer arm mechanism 208 in the transfer chamber 205, the transfer arm mechanism 208a in the extension transfer chamber 216 moves over the range of the transfer chamber 205 and extension transfer chamber 216. With the transfer arm mechanism 208a, the wafer W can be transferred into the vacuum transfer chamber 203 or the processed wafer W on the second buffer 212 can be returned to the wafer cassette 206. As a result, loss of time in case of trouble in the transfer arm mechanism 208 can be prevented.

Figure 14:
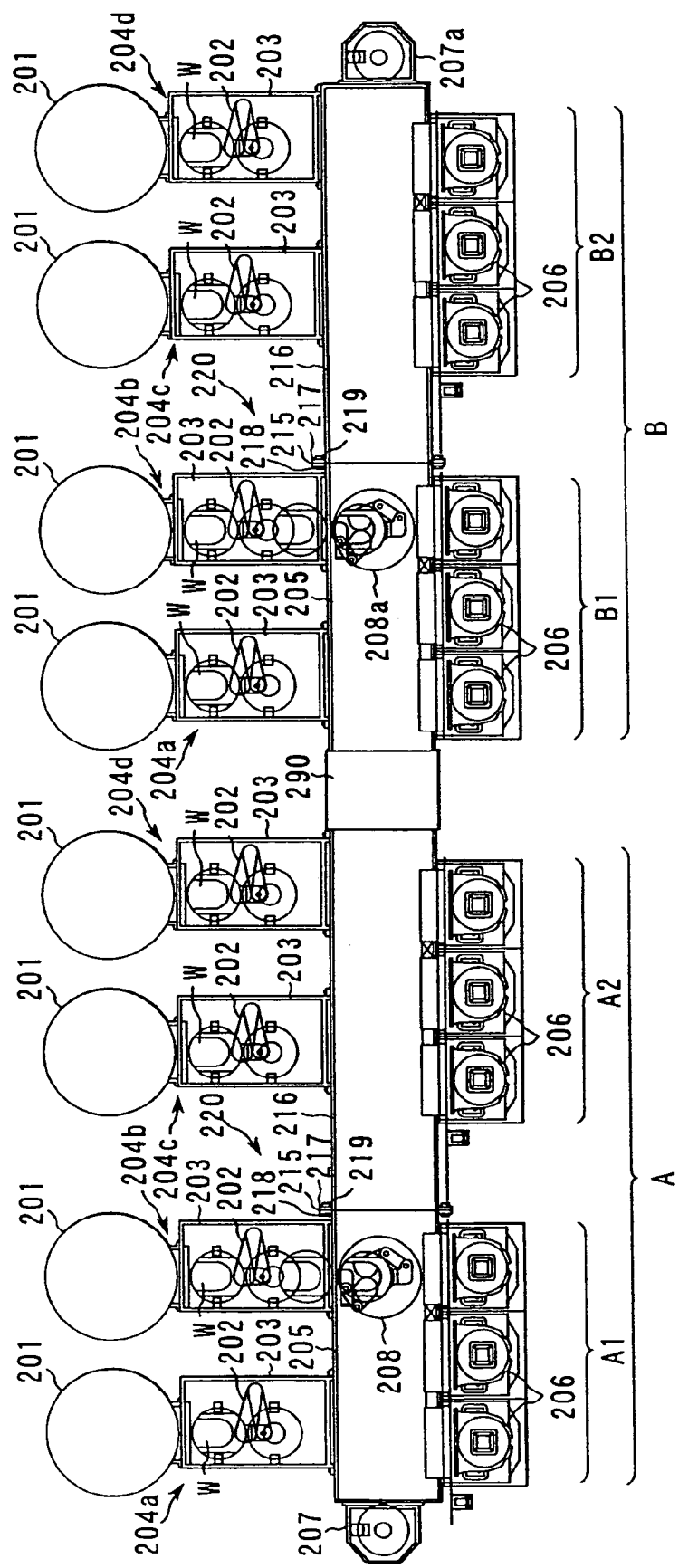
FIG. 14 is a schematic view showing the structure of a vacuum process system according to an eighth embodiment of the present invention.

FIG. 14 shows an eighth embodiment of the present invention. This embodiment is a modification of the sixth embodiment. The structural parts common to those in the sixth embodiment are denoted by like reference numerals and a description thereof is omitted.

In this embodiment, a system A and a system B are detachably connected by means of a connection transfer chamber 290. The system A comprises a unit A1, wherein two modules 204a, 204b are detachably connected to the transfer chamber 205, and a unit A2 wherein two modules 204c, 204d are detachably connected to the extension transfer chamber 216 coupled to the transfer chamber 205. On the other hand, the system B comprises a unit B1, wherein two modules 204a, 204b are detachably connected to the transfer chamber 205, and a unit B2 wherein two modules 204c, 204d are detachably connected to the extension transfer chamber 216 coupled to the transfer chamber 205. The transfer chamber 205 of the unit B1 is connected to the extension transfer chamber 216 of the unit A2 by means of the connection transfer chamber 290.

The system A includes the transfer arm mechanism 208 that is movable over the range of the transfer chamber 205 and extension transfer chamber 216. The system B also includes the transfer arm mechanism 208a that is movable over the range of the transfer chamber 205 and extension transfer chamber 216. Each of the transfer arm mechanisms 208, 208a can move beyond the connection transfer chamber 290 into the other system, where necessary.

According to this structure, when the unit A1, for instance, is subjected to a maintenance work, the transfer arm mechanism 208a enters the extension transfer chamber 216 of the unit A2 and performs transfer operations for the system B and the unit A2.

Figure 15:
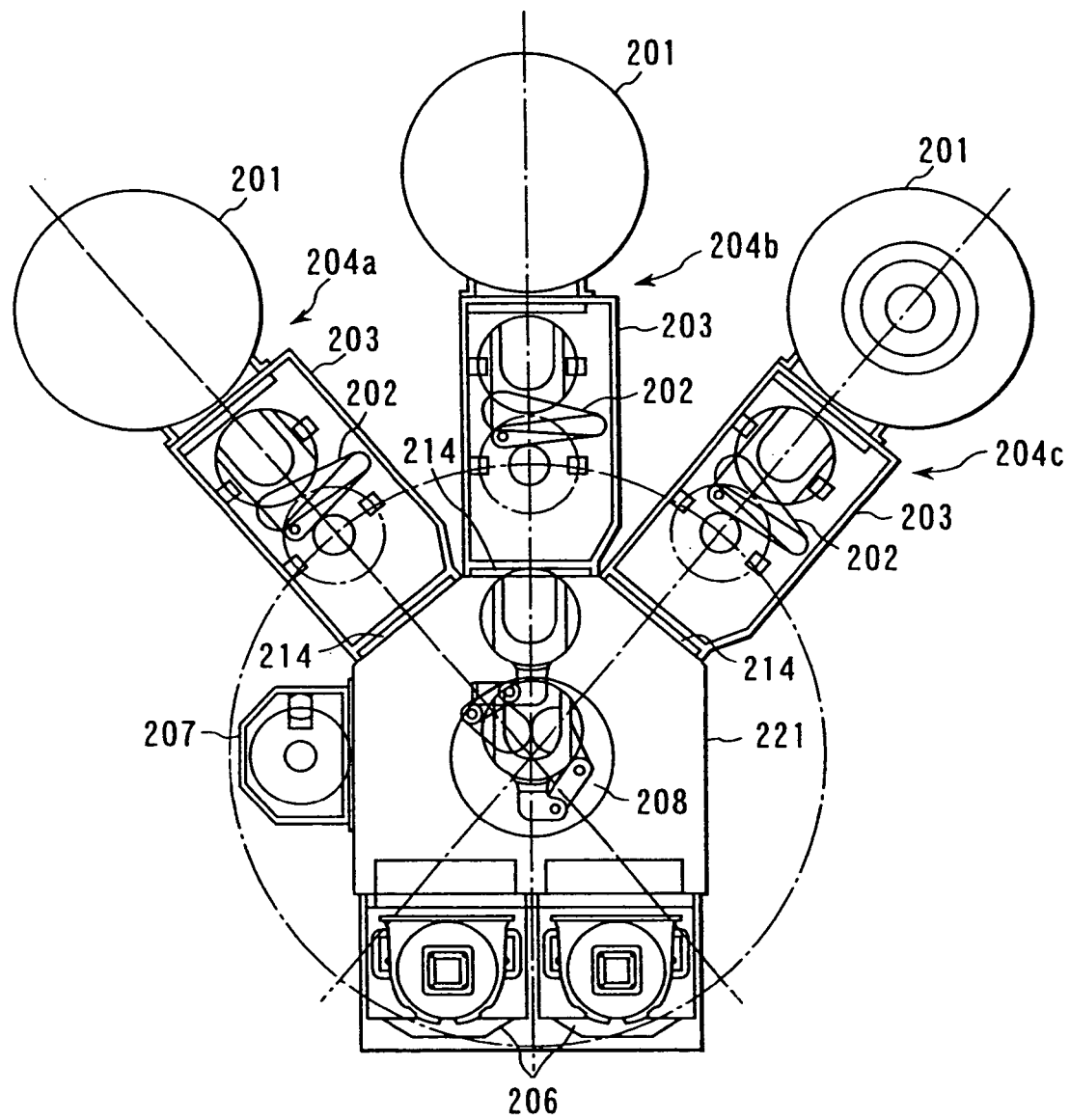
FIG. 15 a schematic view showing another structure of the vacuum process system.

FIG. 15 shows another structure of the vacuum process system. The structural parts common to those in FIGS. 7 and 8 are denoted by like reference numerals and a description thereof is omitted.

A transfer chamber 221 according to this structure has a polygonal shape. A scalar-type dual-arm transfer arm mechanism 208 is provided at a central part of the transfer chamber 221.

Plural wafer cassettes 206 are provided on one side face of the transfer chamber 221. The pre-alignment stage 207 and the modules 204a, 204b, 204c, each comprising the vacuum process chamber 201 and the vacuum transfer chamber 203 including the transfer arm 202, are radially disposed on other side faces of the transfer chamber 221.

In this structure, one wafer W taken out of the wafer cassette 206 by means of the transfer arm mechanism 208 is conveyed into the pre-alignment stage 207 and pre-aligned. The wafer W is then transferred into a given one of the vacuum transfer chambers 203. The wafer W transferred into the vacuum transfer chamber 203 is introduced into the vacuum process chamber 201 by means of the transfer arm 202. The wafer W etched in the vacuum process chamber 201 is transferred into the vacuum transfer chamber 203 by the transfer arm 202. The processed wafer W in the vacuum transfer chamber 203 is returned to the wafer cassette 206 by means of the transfer arm mechanism 208.

According to this structure, since the wafer W can be transferred by the rotation of the transfer arm mechanism 208, the through-put can be enhanced. Moreover, since each module can freely be attached/detached to/from the transfer chamber 221, there is no need to provide a space for maintenance (maintenance area) between the modules. Therefore, the size of the apparatus can be reduced.

Figure 16:
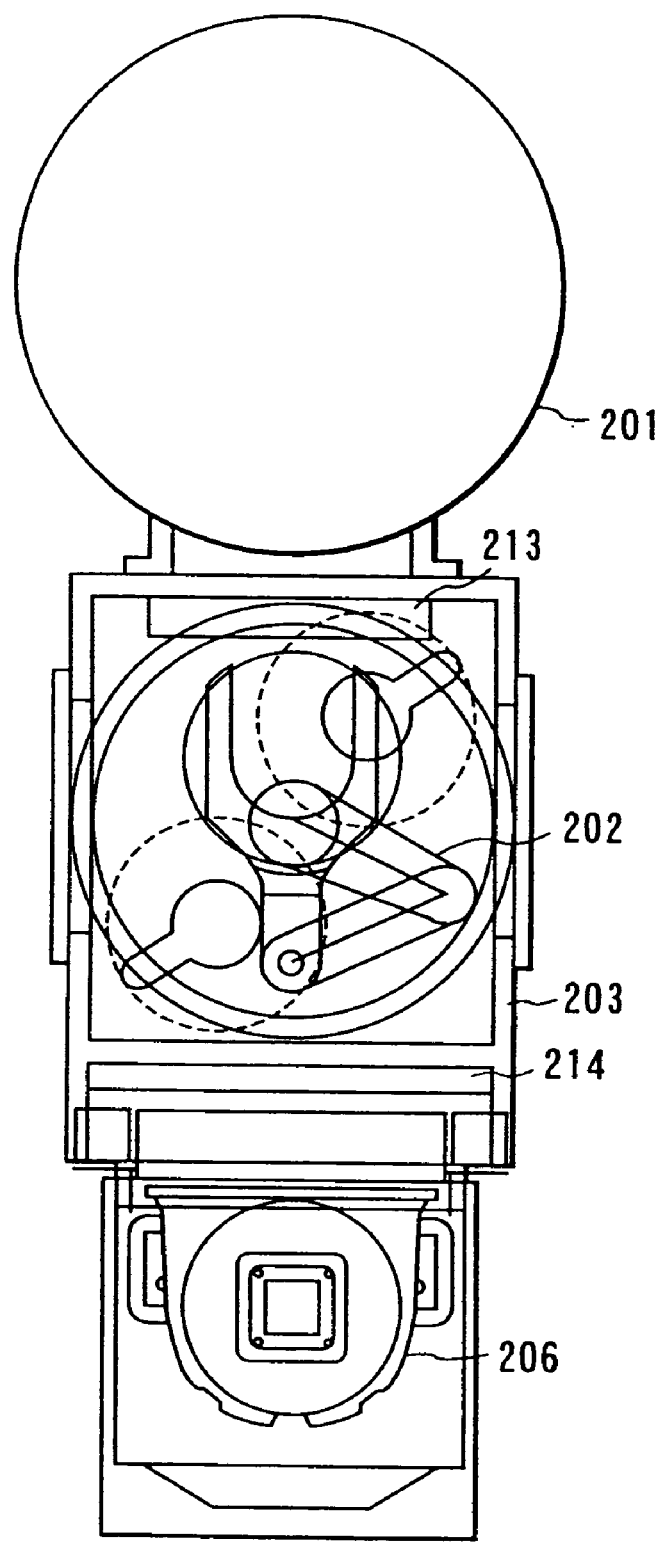
FIG. 16 a schematic view showing another structure of the vacuum process system.

FIG. 16 shows a vacuum process system wherein no transfer chamber is provided. The wafer cassette 206 is directly connected to the atmosphere-side gate valve 214 of the vacuum transfer chamber 203.

In this structure, if the atmosphere-side gate valve 214 is opened, one wafer W is taken out of the wafer cassette 206 by means of the support portion 202a of the transfer arm 202 within the vacuum transfer chamber 203. The wafer W is then introduced into the vacuum transfer chamber 203. The wafer W introduced in the vacuum transfer chamber 203 is conveyed into the vacuum process chamber 201 by the transfer arm 202. The wafer W etched in the vacuum process chamber 201 is transferred into the vacuum transfer chamber 203 by the transfer arm 202 and returned to the wafer cassette 206.

According to this structure, the transfer chamber and transfer arm mechanism are dispensed with, and the structure is simplified. Moreover, the size and cost of the apparatus are reduced.

Figure 17:
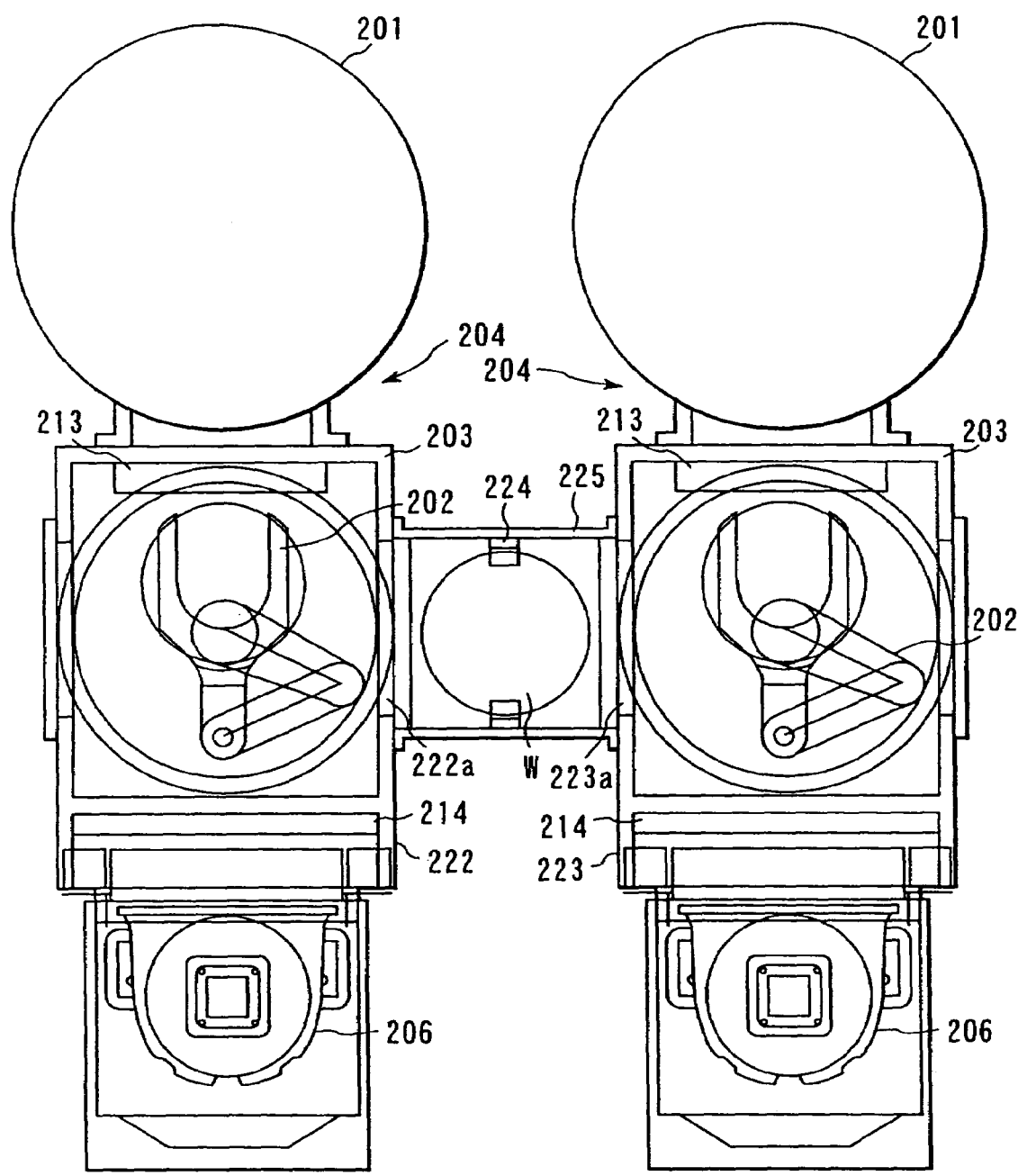
FIG. 17 is a schematic view showing the structure of a modification of the vacuum process system shown in FIG. 16.

FIG. 17 shows a vacuum process system comprising first and second vacuum process systems 222, 223 (modules 204) which are juxtaposed and each have the same structure as shown in FIG. 16. Both systems 222, 223 have their vacuum transfer chambers 203 mutually connected. Specifically, openings 222a and 223a are formed in opposed side faces of the vacuum transfer chambers 203 of the first and second vacuum process devices 222, 223. The openings 222a, 223a are made to communicate with each other in a sealed state by means of a communication path 225. The communication path 225 is provided with a buffer mechanism 224 for supporting the wafer W.

In this structure, if the atmosphere-side gate valve 214 of the vacuum transfer chamber 203 of the first vacuum process system 222 is opened, one wafer W is taken out of the wafer cassette 206 by means of the support portion 202a of the transfer arm 202 of the vacuum transfer chamber 203, and the wafer W is conveyed into the vacuum transfer chamber 203. The wafer W conveyed into the vacuum transfer chamber 203 of the first vacuum process system 222 is directly introduced into the vacuum process chamber 201 by means of the transfer arm 202.

The wafer W etched in the vacuum process chamber 201 is transferred into the vacuum transfer chamber 203 by the transfer arm 202 and introduced into the buffer mechanism 224. The transfer arm 202 within the vacuum transfer chamber 203 of the second vacuum transfer system 223 receives the wafer W supported on the buffer mechanism 224 and transfers it into the vacuum transfer chamber 203. Subsequently, the transfer arm 202 transfers the wafer W from the vacuum transfer chamber 203 of the second vacuum process system 223 into the vacuum process chamber 201. The wafer W etched in the vacuum process chamber 201 of the second vacuum process system 223 is transferred by the transfer arm 202 into the vacuum transfer chamber 203 and then returned to the wafer cassette 206.

According to this structure, the wafer W can efficiently be subjected to plural processes. Moreover, the transfer chamber and transfer arm mechanism are dispensed with, and the structure is simplified. Besides, the size and cost of the apparatus are reduced.

The invention claimed is:

1. A vacuum processing system comprising:
   a common transfer chamber extending in a first direction;
   a plurality of process units linearly extending from the common transfer chamber in a second direction normal to the first direction, each of the process units including a process chamber in which an object is processed and a transfer chamber positioned between the process chamber and the common transfer chamber;
   a first transfer device for transferring objects between the transfer chambers and the common transfer chamber; and
   a plurality of second transfer devices, each of the transfer chambers including a second transfer device to linearly move an object in the second direction in order to transfer the object between the process chamber and the transfer chamber of the same process unit, the second transfer device of each transfer chamber being inhibited to transfer the object to another transfer chamber,
   wherein each of the process units includes a gate valve provided between the transfer chamber and the common transfer chamber through which an object is transferred between the transfer chamber and the common transfer chamber by at least one of the first and second transfer devices.

2. The vacuum processing system according to claim 1, in which the first transfer device is movable within the common transfer chamber in the first direction.

3. The vacuum processing system according to claim 1, in which each transfer chamber includes first and second buffers provided therein and selectively supporting an object in the transfer chamber.

4. The vacuum processing system according to claim 1, in which at least one of the second transfer devices includes a supporting portion on which an object is mounted, and the supporting portion is only movable in the second direction during the transferring of the object.

5. The vacuum processing system according to claim 1, in which each transfer chamber has an inner space which is changeable between a vacuum state and an atmosphere state.

6. The vacuum processing system according to claim 1, in which the transfer chambers have inner spaces which are independently changeable between a vacuum state and an atmosphere state.

7. A vacuum processing system comprising:
   a common transfer chamber having a first transfer device provided therein, the first transfer device being movable in a first direction; and
   a plurality of process units, each of which includes a process section for processing an object, a vacuum transfer chamber, and a second transfer device provided in the vacuum transfer chamber and configured to transfer an object between the process section and the vacuum transfer chamber,
   wherein said plurality of process units are arranged along the first direction, the first transfer device transfers objects between the common transfer chamber and the vacuum transfer chambers, and each of said second transfer devices linearly moves an object in a direction normal to the first direction, when the second transfer device transfers the object between the process section and the vacuum transfer chamber.

8. The vacuum processing system according to claim 7, in which each vacuum transfer chamber includes first and second buffers provided therein and selectively supporting an object in vacuum transfer chamber.

9. The vacuum processing system according to claim 7, in which the vacuum transfer chambers have inner spaces which are independently changeable between a vacuum state and an atmosphere state.

* * * * *